(12) United States Patent
Xie et al.

(10) Patent No.: US 12,009,395 B2
(45) Date of Patent: Jun. 11, 2024

(54) SELF-ALIGNED BLOCK FOR VERTICAL FETS

(71) Applicant: International Business Machines Corporation, Armonk, NY (US)

(72) Inventors: Ruilong Xie, Niskayuna, NY (US); Junli Wang, Slingerlands, NY (US); Choonghyun Lee, Chigasaki (JP); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 59 days.

(21) Appl. No.: 17/404,014

(22) Filed: Aug. 17, 2021

(65) Prior Publication Data

US 2023/0055297 A1    Feb. 23, 2023

(51) Int. Cl.
| | |
|---|---|
| *H01L 29/417* | (2006.01) |
| *H01L 21/8238* | (2006.01) |
| *H01L 27/092* | (2006.01) |
| *H01L 29/06* | (2006.01) |
| *H01L 29/423* | (2006.01) |
| *H01L 29/78* | (2006.01) |

(52) U.S. Cl.
CPC ............ *H01L 29/41741* (2013.01); *H01L 21/823871* (2013.01); *H01L 21/823885* (2013.01); *H01L 27/092* (2013.01); *H01L 27/0924* (2013.01); *H01L 29/0653* (2013.01); *H01L 29/42376* (2013.01); *H01L 29/7827* (2013.01); *H01L 29/785* (2013.01)

(58) Field of Classification Search
CPC ......... H01L 29/7827; H01L 29/66666; H01L 29/41741; H01L 29/66545; H01L 21/823885; H01L 21/823871; H01L 27/092; H01L 29/42376; H01L 29/0653
See application file for complete search history.

(56) References Cited

U.S. PATENT DOCUMENTS

| | | | |
|---|---|---|---|
| 9,236,269 B2 | 1/2016 | Kozarsky | |
| 9,780,208 B1 | 10/2017 | Xie | |
| 9,786,563 B2 | 10/2017 | Basker | |
| 9,865,705 B2 | 1/2018 | Cheng | |
| 9,972,494 B1 | 5/2018 | Bentley | |
| 10,103,247 B1 | 10/2018 | Xie | |
| 10,312,154 B2 | 6/2019 | Xie | |
| 10,497,798 B2 | 12/2019 | Xie | |
| 2017/0110559 A1* | 4/2017 | Chuang | H01L 29/0653 |
| 2018/0218949 A1* | 8/2018 | Balakrishnan | H01L 21/3081 |
| 2018/0308930 A1* | 10/2018 | Xie | H01L 29/0653 |
| 2019/0172940 A1 | 6/2019 | Greene | |
| 2019/0287863 A1* | 9/2019 | Xie | H01L 29/4238 |
| 2020/0066604 A1 | 2/2020 | Mochizuki | |

* cited by examiner

*Primary Examiner* — Michael M Trinh
(74) *Attorney, Agent, or Firm* — Matthew Zehrer

(57) ABSTRACT

A vertical FET includes a channel fin between a bottom source/drain (S/D) region and a top S/D region, a gate upon a sidewall of the channel fin, a top metallization upon the top S/D region, a first contact metallization connected to the gate, a second contact metallization connected to the bottom S/D region, a first vertical liner between a portion of the gate and the first contact metallization, and a second vertical liner between the top metallization and the second contact metallization. The vertical FET may be fabricated by forming a self-aligned block and utilizing the self-aligned block to e.g., prevent gate to gate shorting during replacement gate formation or processing.

14 Claims, 22 Drawing Sheets

SELF-ALIGNED BLOCK FOR VERTICAL FETS

BACKGROUND

Various embodiments of the present application generally relate semiconductor device fabrication methods and resulting structures. More specifically the various embodiments relate to vertical field-effect transistors (FETs) that include a self-aligned block therebetween.

SUMMARY

In an embodiment of the present invention, a semiconductor device is presented. The semiconductor device includes a channel fin between a bottom source/drain (S/D) region and a top S/D region. The semiconductor device includes a gate upon a sidewall of the channel fin, a top metallization upon the top S/D region, a first contact metallization connected to the gate, and a second contact metallization connected to the bottom S/D region. The semiconductor device further includes a first vertical liner between a portion of the gate and the first contact metallization and a second vertical liner between the top metallization and the second contact metallization.

In another embodiment of the present invention, a semiconductor device is presented. The semiconductor device includes a pFET and a nFET. The pFET includes a pFET channel fin between a pFET bottom source/drain (S/D) region and a pFET top S/D region, a pFET gate upon a sidewall of the pFET channel fin; a pFET top metallization upon the pFET top S/D region, a pFET contact metallization connected to the pFET bottom S/D region, and a pFET vertical liner between the pFET top metallization and the pFET contact metallization. The nFET includes a nFET channel fin between a nFET bottom S/D region and a nFET top S/D region, a nFET gate upon a sidewall of the nFET channel fin, a nFET top metallization upon the nFET top S/D region, a nFET contact metallization connected to the nFET bottom S/D region, and a nFET vertical liner between the nFET top metallization and the nFET contact metallization. The semiconductor device further includes a shared contact metallization connected to the pFET gate and connected to the nFET gate and a shared vertical liner between a portion of the pFET gate and the shared contact metallization and between a portion of the nFET gate and the shared contact metallization.

In another embodiment of the present invention, a semiconductor device fabrication method is presented. The method includes forming a first fin upon a substrate and forming a second fin upon the substrate. The method further includes forming a first bottom source/drain (S/D) region below the first fin and forming a second bottom S/D region below the second fin. The method further includes forming a first sacrificial gate upon a sidewall of the first fin and forming a second sacrificial gate upon a sidewall of the second fin. The method further includes forming a first vertical liner upon the first sacrificial gate and forming a second vertical liner upon the second sacrificial gate. The method further includes forming a self-aligned block between the first sacrificial gate and the second sacrificial gate and between the first vertical liner and the second vertical liner. The method further includes removing the first sacrificial gate and the second sacrificial gate. The method further includes forming a first replacement gate upon a sidewall of the first fin, upon the first vertical liner, and upon the self-aligned block and forming a second replacement gate upon a sidewall of the second fin, upon the second vertical liner, and upon the self-aligned block. The method further includes removing the self-aligned block to form a metallization contact trench. The method further includes forming a metallization contact connected to the first replacement gate and the second replacement gate within metallization contact trench.

These and other embodiments, features, aspects, and advantages will become better understood with reference to the following description, appended claims, and accompanying drawings.

DETAILED DESCRIPTION

Figure 1:
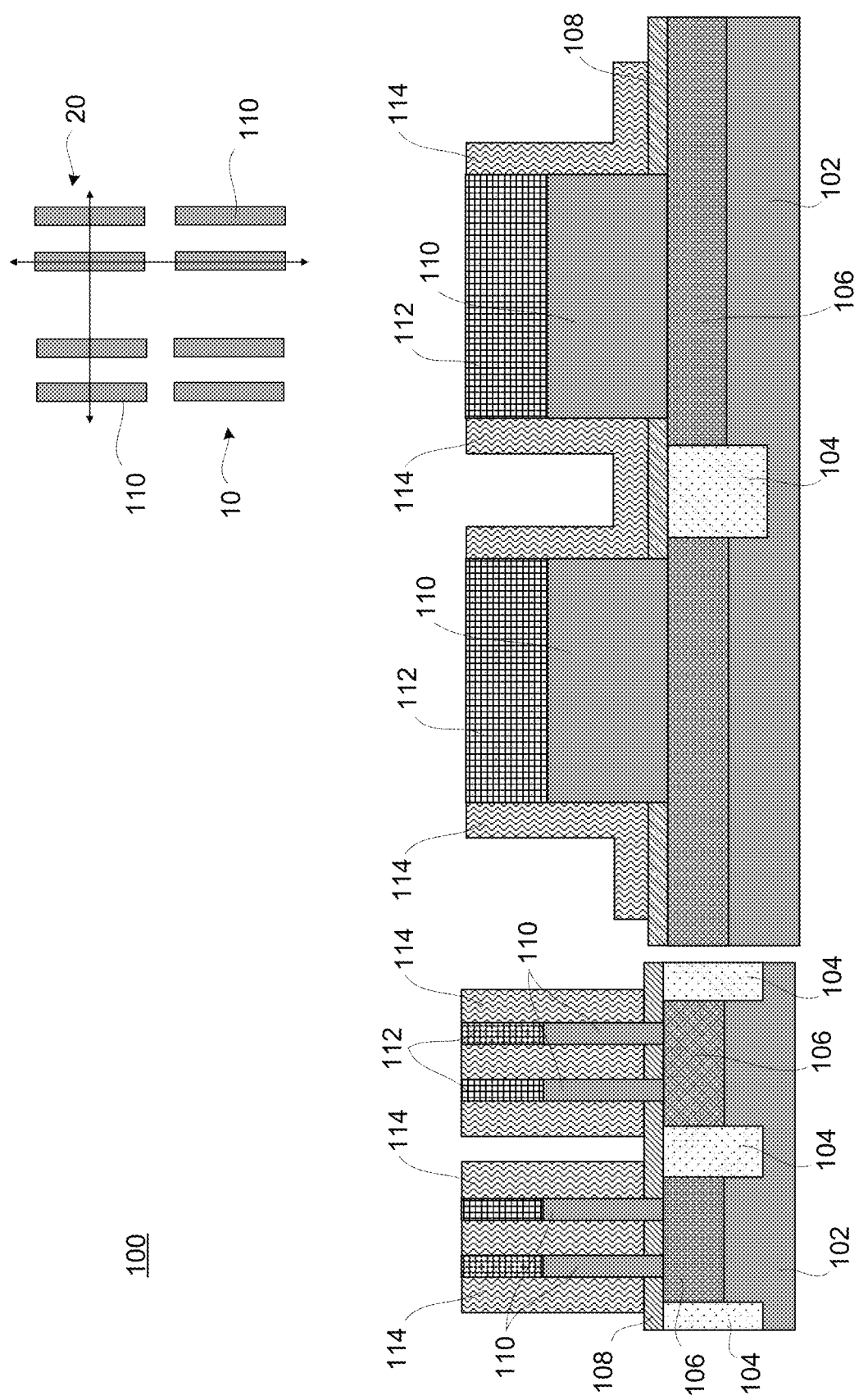
FIG. 1 through FIG. 18 depict cross-sectional views of a semiconductor structure shown after fabrication operations, in accordance with one or more embodiments.

It is understood in advance that although a detailed description is provided herein of an exemplary vertical FET architecture formed having a self-aligned block between a vertical pFET and a vertical nFET, implementation of the teachings recited herein are not limited to the particular FET architecture described herein. Rather, embodiments of the present invention are capable of being implemented in conjunction with any other appropriate type of FET device now known or later developed.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" upon layer "B" include situations in which one or more intermediate layers (e.g., layer "C") is between layer "A" and layer "B" as long as the relevant characteristics and functionalities of layer "A" and layer "B" are not substantially changed by the intermediate layer(s).

For purposes of the description hereinafter, the terms "upper," "lower," "right," "left," "vertical," "horizontal," "top," "bottom," and derivatives thereof relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact," or the like, means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, substantial coplanarity between various materials can include an appropriate manufacturing tolerance of ±8%, ±5%, ±2%, or the like, difference between the coplanar materials.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of technologies that are more specifically relevant to aspects of the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Semiconductor devices can be formed in the active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate. The gate and the body are spaced apart by a gate dielectric layer. The channel connects the source and the drain, and electrical current flows through the channel from the source to the drain. The electrical current flow is induced in the channel region by a voltage applied at the gate.

One or more embodiments of the invention also provide fabrication methods and resulting vertical FET structures that may be formed with a self-aligned block between a vertical pFET and a vertical nFET. The self-aligned block may aid in increasing the overall density of the vertical FET structures, thereby increasing the efficiency and resulting compute power of the vertical FET structures per unit area or size. Such fabrication methods and resulting semiconductor device structures, in accordance with embodiments of the invention, are described in detail below by referring to the accompanying drawings.

FIG. 1 depicts cross-sectional views of a semiconductor device or structure 100 shown after fabrication operations, in accordance with one or more embodiments. Semiconductor structure 100 may include a vertical FET structure that has one or more vertical pFETs 10 and one or more vertical nFETs 20. A vertical FET, as is generally known in the art, is a FET in which the source and drain of the FET are arranged vertically and current flows perpendicular with respect to the horizontal wafer surface. The cross-section views of the depicted semiconductor structures are defined by the cross-sectional planes depicted and are used throughout the remaining drawings.

After associated fabrication operations, semiconductor structure 100 may include a substrate 102, one or more shallow trench isolation (STI) regions 104, one or more bottom source/drain (S/D) regions 106, one or more bottom spacers 108, one or more channel fins 110, hereinafter referred to as fins 110, one or more mask region 112, and one or more sacrificial gates 114.

Non-limiting examples of suitable materials for the substrate 102 include Si (silicon), strained Si, SiC (silicon carbide), Ge (germanium), SiGe (silicon germanium), SiGe:C (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb). The substrate 102 can be a bulk semiconductor material that includes Si, a silicon on insulator (SOI) substrate, or the like.

A mask 112 may be formed upon the substrate 102. The mask 112 may be formed by deposition of mask materials or layers of mask material(s) upon a top surface of substrate 102. In a particular embodiment, mask 112 may be a hard mask. Exemplary mask 112 materials may be silicon nitride (SiN), a combination of SiN and Silicon Dioxide ($SiO_2$), or the like.

The substrate 102 and mask 112 may be patterned and undesired portions thereof may be removed while desired portions thereof may be retained and may form fins 110. In some embodiments, a thin sacrificial fin sidewall protection layer can be formed upon the sidewall(s) of fins 110 by e.g., ALD deposition followed by anisotropic etch. Portion(s) of substrate 102 may be exposed and such exposed portions of substrate 102 may be at least partially recessed to form bottom S/D cavities.

In some embodiments, the bottom S/D regions 106 may be formed within the bottom S/D cavities by epitaxially growing one layer and then the next until the desired thicknesses of such layers are achieved. The epitaxy thickness may be chosen so that the epitaxy generally fills the bottom S/D cavities. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on its associated pFET 10 or nFET 20.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments of the invention, epitaxial growth and/or deposition processes are selective to forming on semiconductor surfaces, and generally do not deposit material on exposed surfaces, such as silicon dioxide or silicon nitride surfaces.

In some embodiments of the invention, the gas source for the deposition of epitaxial semiconductor material can include a silicon containing gas source, a germanium containing gas source, or a combination thereof. For example, an epitaxial silicon layer can be deposited from a silicon gas source that is selected from the group consisting of silane, di silane, trisilane, tetrasilane, hexachlorodisilane, tetrachlorosilane, dichlorosilane, trichlorosilane, methyl silane, dimethylsilane, ethyl silane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium, and argon can be used.

The substrate 102 and a bottom S/D region 106 layer may be patterned utilizing known techniques in the art to form STI region trenches. STI regions 104 may be formed by depositing STI material(s), such as a dielectric known in the art, within the STI region trenches. Subsequently, structure 100 surfaces may be planarized by e.g. a CMP, a dielectric recess, or the like. The STI regions 104 may be formed by depositing the STI material by for example, PVD, CVD, ALD, or the like. As is known in the art, STI regions 106 may, at least partially, electrically isolate neighboring vertical FETs, components or features of neighboring vertical FETs, or the like.

A bottom spacer 108 may be formed as a layer upon the bottom S/D regions 106 and STI regions 104. Bottom spacer 108 may be formed by depositing spacer material upon the S/D regions 106 and STI regions 104. Exemplary bottom spacer 108 materials may be SiN, silicoboron carbonitride (SiBCN), silicon oxycabonitride (SiOCN), or the like.

The bottom spacer 108 may be formed by using directional dielectric deposition techniques, such as high density plasma (HDP) SiN deposition, gas cluster ion beam (GCIB) dielectric deposition, etc. Alternatively, bottom spacer 108 may be formed by over deposition of bottom spacer material followed by a planarization, such as a CMP, dielectric recess, or the like.

Sacrificial gates 114 may be formed upon bottom spacer 108, upon sidewalls of fins 110, and upon sidewalls of mask 112. Sacrificial gates 114 may be formed by depositing sacrificial gate material, materials, or layers of material(s), by PVD, CVD, ALD, or the like. Exemplary sacrificial gate 114 materials may be silicon oxide, conformal amorphous SiGe, Titanium Oxide (TiOx), Aluminum Oxide (AlOx), or the like.

In some embodiments, a sacrificial gate material layer may be formed upon the bottom spacers 108, upon fin 110 sidewalls, and upon mask 112 and patterned. Undesired portions of the sacrificial gate material layer may be removed, and desired portions of the sacrificial gate material layer may be retained to thereby form the sacrificial gates 114. The thickness of the sacrificial gate 114 may be chosen such that the space within each device 10, 20 is fully pinched-off (the space between the fins 110 within pFET 10 and the space between the fins 110 within nFET 20), and the space between different transistors, or between pFET 10 and nFET 20 is not pinched-off. This may provide for self-aligned block 122 formation as is exemplary depicted and described in association with FIG. 11. Subsequent to sacrificial gate 114 is formation, a soft mask, such as organic planarization layer (OPL) may be deposited and recessed, followed by etching away the topmost portion(s) of sacrificial gate 114 that are above mask 112. Subsequently, sacrificial gate 114 may be patterned and etched to remove undesired sacrificial gate 114 material over or above bottom spacer 108.

Figure 2:
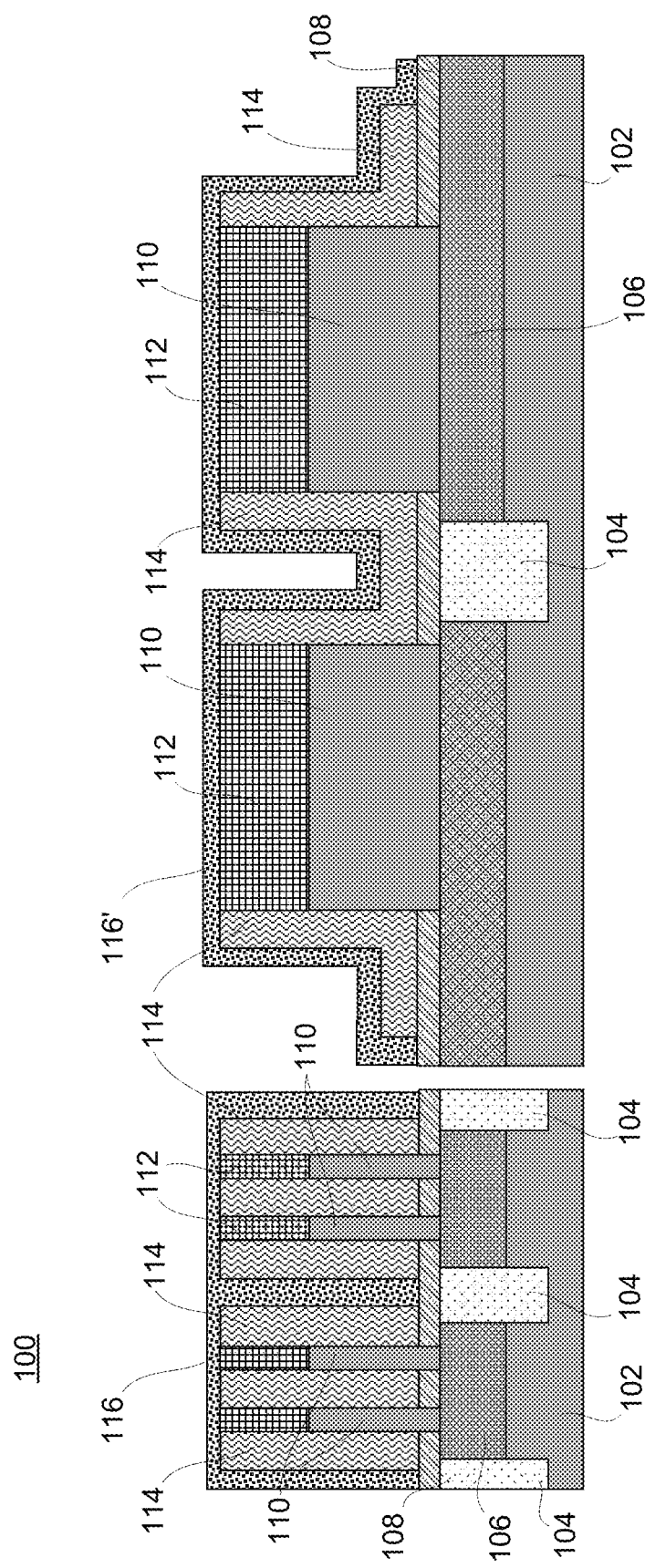

FIG. 2 depicts cross-sectional views of semiconductor structure 100 shown after a fabrication operation, in accordance with one or more embodiments. At the present fabrication operation, a dielectric liner 116' is formed upon bottom spacer(s) 108, upon one or more surfaces of sacrificial gates 114, and upon one or more surfaces of mask 112. The dielectric liner 116' may be formed by depositing a dielectric liner 116' material by PVD, CVD, ALD, or the like.

Dielectric liner 116' can have a thickness of from about 3 nm to about 40 nm, although other thicknesses are within the contemplated scope. Exemplary dielectric liner 116 materials may be but are not limited to: SiN, SiC, silicon oxynitride (SiON), carbon-doped silicon oxide (SiOC), silicon-carbon-nitride (SiCN), boron nitride (BN), silicon boron nitride (SiBN), SiBCN, SiOCN, silicon oxide (SiOx), or the like. The dielectric liner 116 can be a low-k material having a dielectric constant less than about 7, less than about 5, or the like.

The thickness of the dielectric liner 116 may be chosen, such that space between near or neighboring FETs within pFET 10 region and within nFET 20 region is filled or pinched-off, however, the space between pFET 10 and nFET 20, or space at nFET 20 tip-to-tip, or space at pFET 10 tip-to-tip, is not pinched-off. As such, the non-pinched-off space between sacrificial gates 114 may become a self-aligned block. With combination of sacrificial gate 114 and dielectric liner 116, each row of pFETs 10 and/or nFETs 20 may become a bigger self-aligned block.

Figure 3:
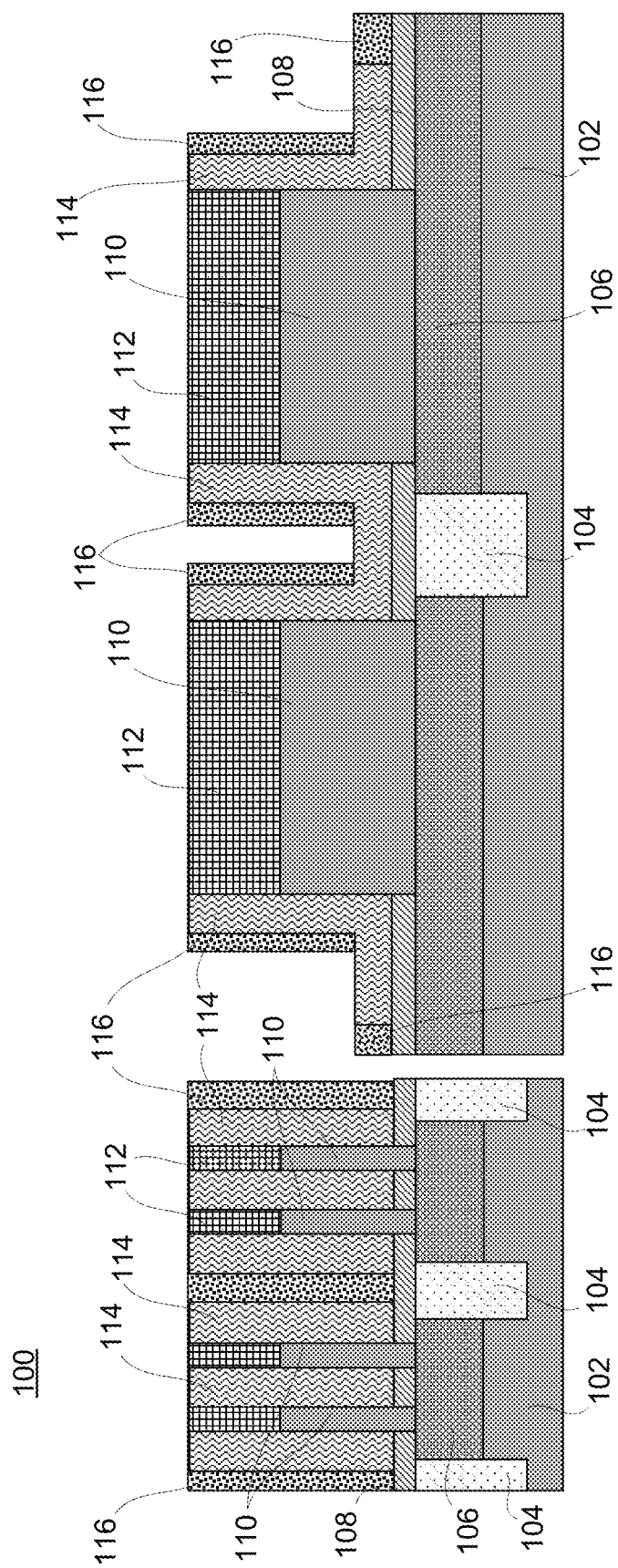

FIG. 3 depicts cross-sectional views of semiconductor structure 100 shown after a fabrication operation, in accordance with one or more embodiments. At the present fabrication operation, portions of dielectric liner 116' at horizontal surfaces are removed The horizontal portions of dielectric liner 116 may be removed by known etching techniques, such as an anisotropic etch. The undesired portions of dielectric liner 116 may be associated with or juxtaposed against respective upper surfaces of sacrificial gates 114. The formed vertical liners 116 may therefore be effectively formed upon the vertical sidewalls of sacrificial gates 114. Further, some vertical liners 116 may be effectively formed upon the vertical sidewalls of sacrificial gates 114 and upon a upper surface of a respective spacer 108.

Figure 4:
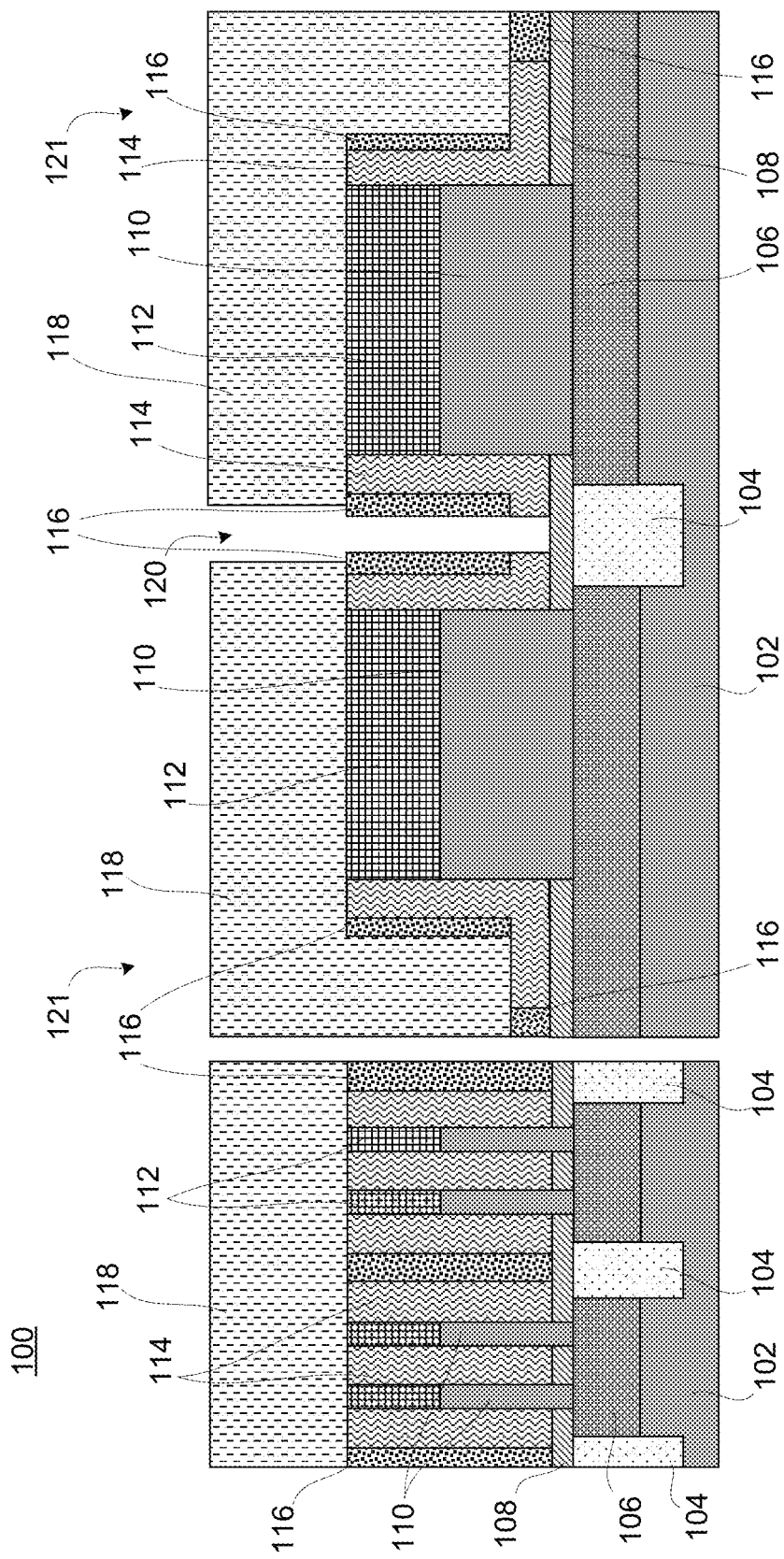

FIG. 4 depicts cross-sectional views of semiconductor structure 100 shown after a fabrication operation, in accordance with one or more embodiments. At the present fabrication operation, a mask layer 118 is formed, an p/n boundary gate trench 120 is formed therewithin within a semiconductor structure 100 p/n boundary region that separates vertical pFET 10 from vertical nFET 20, and gate trench 121 (not depicted) may be formed therewithin.

The mask layer 118 may be formed by depositing a soft mask material by spin-on coat, or the like. Exemplary mask layer 118 materials may be an OPL, or the like.

Undesired portions of mask layer 118 may be removed by known patterning, lithography, and etching techniques to expose a portion of the underlying sacrificial gate 114. Subsequently, a self-aligned etch process may selectively remove the underlying exposed portion(s) of sacrificial gate 114 to effectively form p/n boundary gate trench 120 and/or gate trench 121. p/n boundary gate trench 120. Such application trench 120, 121 may expose respective facing vertical sidewalls of a pFET 10 vertical liner 116 and a nFET 20 vertical liner 116; may expose respective facing vertical sidewalls of a pFET 10 sacrificial gate 114 and a nFET 20 sacrificial gate 114; and/or may expose a portion of a top surface of spacer 108 between pFET 10 and nFET 20. A pFET 10 gate trench 121 (depicted, for example, in FIG. 5 as an associated trench to define and form sacrificial spacers 122) may expose a vertical sidewall of a pFET 10 vertical liner 116 and may expose a portion of a top surface of a pFET 10 sacrificial gate 114. A nFET 20 gate trench 121 may expose a vertical sidewall of a nFET 20 vertical liner 116 and may expose a portion of a top surface of a nFET 20 sacrificial gate 114.

Figure 5:
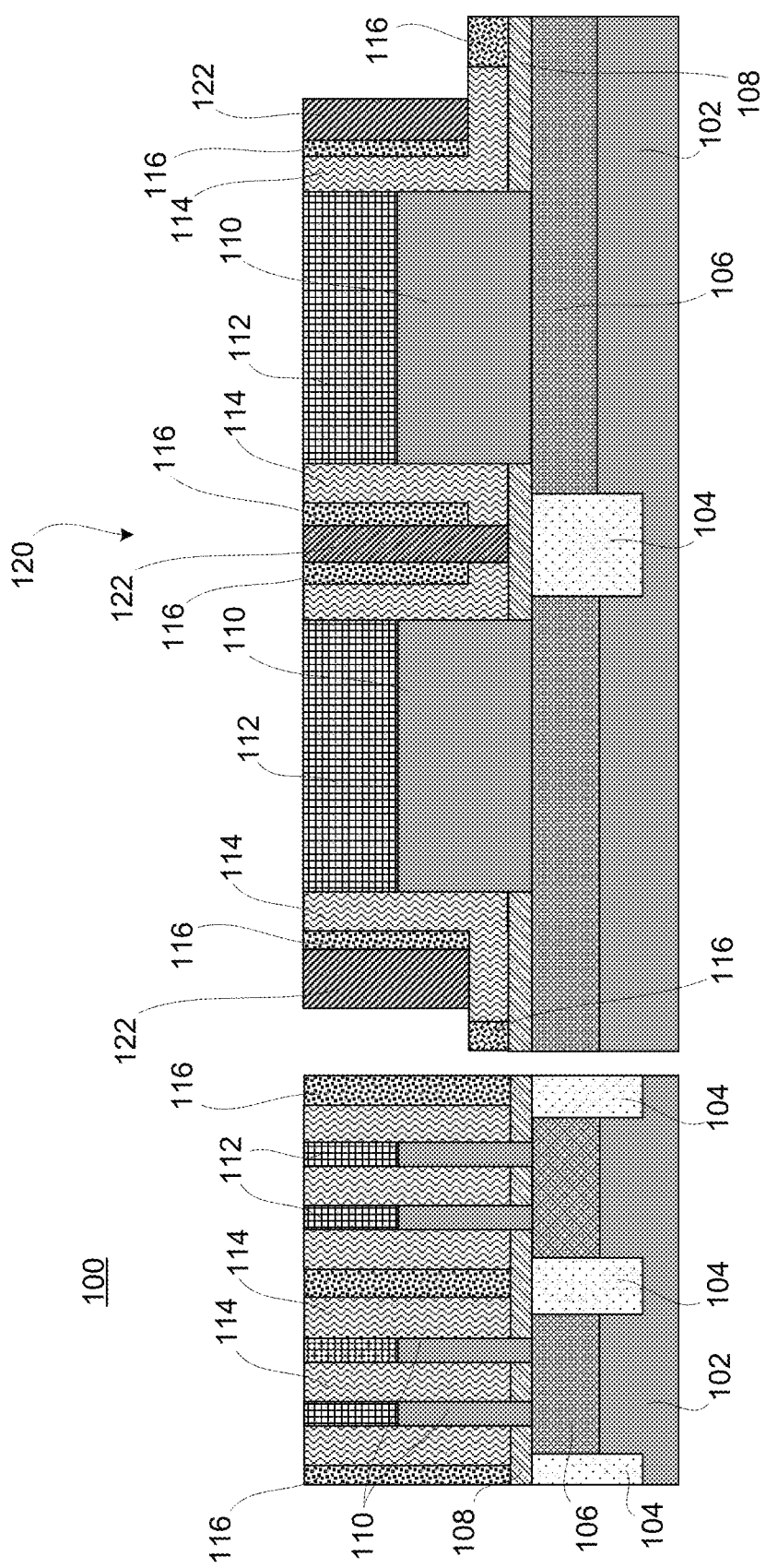

FIG. 5 depicts cross-sectional views of semiconductor structure 100 shown after a fabrication operation, in accordance with one or more embodiments. At the present fabrication operation, the mask layer 118 may be removed and sacrificial spacers 122 are formed within p/n boundary gate trench 120 and are formed within gate trench(s) 121. The thickness of the sacrificial spacer 122 may be chosen such that spacer 118 between nFET 20 tip and pFET 10 tip is pinched-off, however, the space between nFET 20 tip-to-tip or pFET 10 tip-to-tip is not pinched-off. By doing so, the self-aligned block between pFET 10 and nFET 20 may be enlarged or relatively increased compared to the art.

Sacrificial spacers 122 may be formed by depositing a dielectric material by PVD, CVD, ALD, or the like. Exemplary sacrificial spacer 122 materials may be but are not limited to: AlOx, amorphous SiGe, or the like.

A sacrificial spacer 122 may be formed within p/n boundary gate trench 120 upon the respective facing vertical sidewalls of a pFET 10 vertical liner 116 and a nFET 20 vertical liner 116; upon the respective facing vertical sidewalls of a pFET 10 sacrificial gate 114 and a nFET 20 sacrificial gate 114; and upon the top surface of spacer 108 between pFET 10 and nFET 20.

A sacrificial spacer 122 may be formed within the pFET 10 gate trench 121 upon the vertical sidewall of the pFET 10 vertical liner 116 and upon the portion of the top surface of a pFET 10 sacrificial gate 114. A sacrificial spacer 122 may be formed within the nFET 20 gate trench 121 upon the vertical sidewall of nFET 20 vertical liner 116 and upon the portion of the top surface of a nFET 20 sacrificial gate 114.

Figure 6:
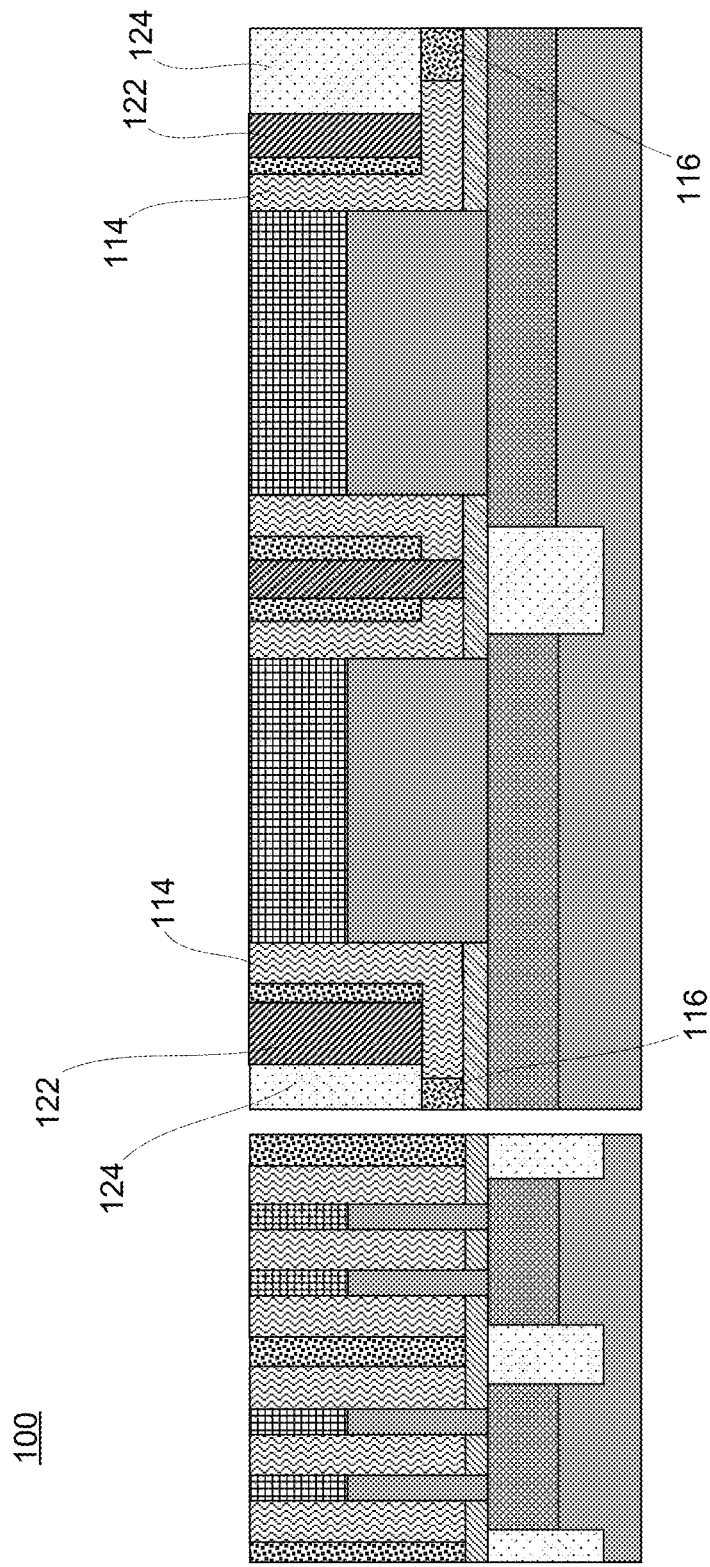

FIG. 6 depicts cross-sectional views of semiconductor structure 100 shown after a fabrication operation, in accordance with one or more embodiments. At the present fabrication operation, ILD 124 is formed upon the semiconductor structure 100. Subsequently, the upper surface of the semiconductor structure 100 may be planarized by e.g., a CMP, or the like.

ILD 124 may be formed by depositing a dielectric material by PVD, CVD, ALD, or the like. Exemplary ILD 124 material(s) may be but are not limited to: SiO$_2$, a thin liner of SiN followed by SiO2, or the like.

ILD 124 may be formed within crevasses, trenches, or the like, within semiconductor structure 100. For example, ILD 124 may be formed within a trench upon a pFET 10 vertical sidewall of sacrificial spacer 122, upon a portion of an internal top surface of a pFET 10 sacrificial gate 114, upon at least a portion of a top surface of a pFET 10 liner 116. Similarly, ILD 124 may be formed within a trench upon a nFET 20 vertical sidewall of sacrificial spacer 122, upon a portion of an internal top surface of a nFET 20 sacrificial gate 114, upon at least a portion of a top surface of a nFET 20 liner 116.

Subsequently, the top surface of semiconductor structure 100 may be planarized by, e.g., a CMP, or the like. For example, the respective top surfaces of ILD(s) 124, sacrificial spacer(s) 122, vertical spacer(s) 116, sacrificial gate(s) 114, mask(s) 112, etc. may be coplanar.

Figure 7:
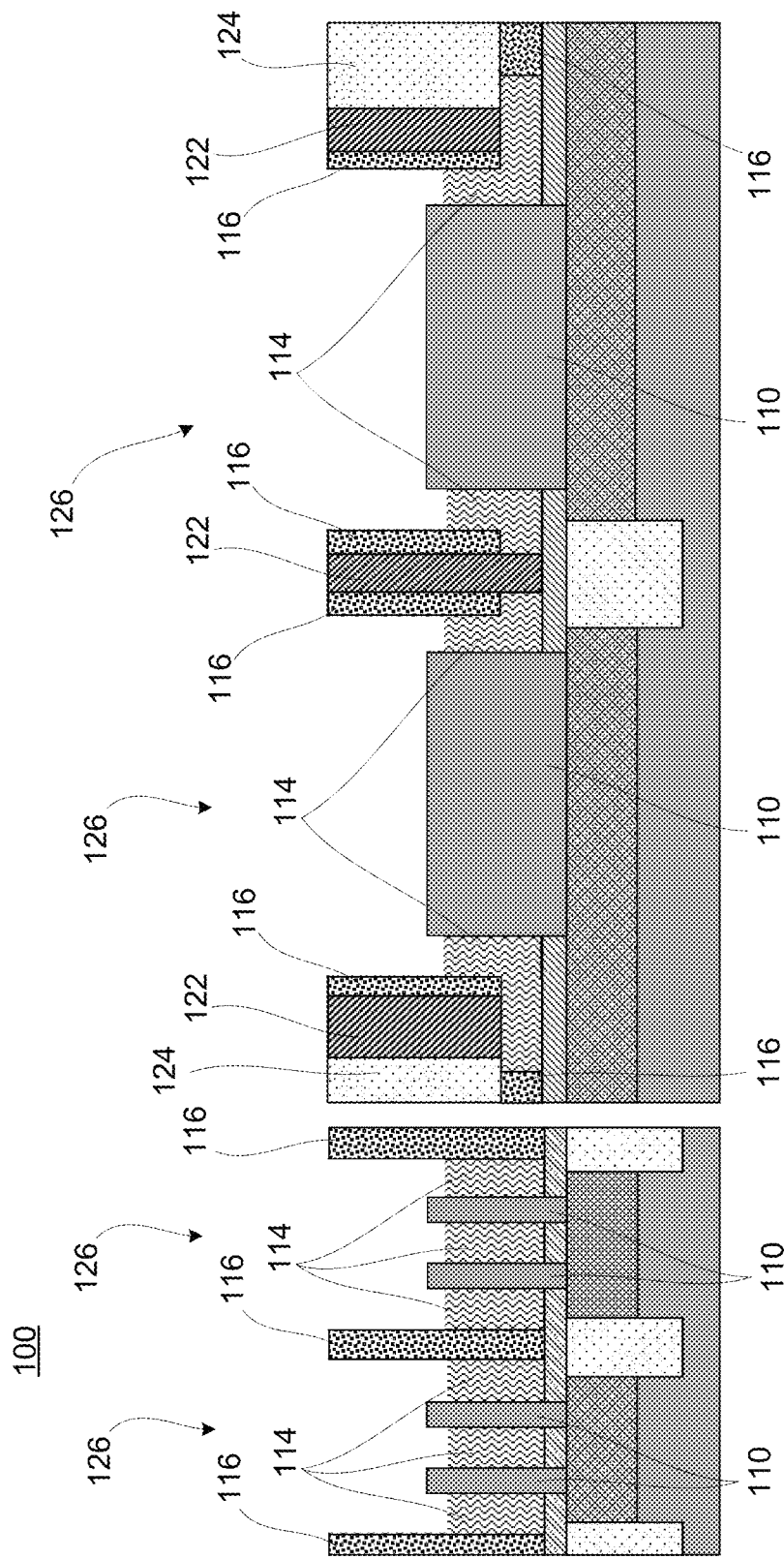

FIG. 7 depicts cross-sectional views of semiconductor structure 100 shown after a fabrication operation, in accordance with one or more embodiments. At the present fabrication operation, mask 112 is removed and sacrificial gates 114 are partially recessed.

Mask 112 may be removed and sacrificial gates 114 may be partially recessed by known etching techniques, or the like. For example, a single etching stage or etchant may remove mask 112 and partially remove sacrificial gates 114. Alternatively, a dual stage or dual etchant process may first remove mask 112 and subsequently partially remove sacrificial gates 114. The materials of mask 112 and sacrificial gates 114 may be chosen to obtain etch selectively relative to the other exposed or desired materials/features (e.g., spacers 116, sacrificial spacer 122, ILD 124, fins 110, etc.) of structure 100.

In a particular embodiment, as depicted, the top surface of the recessed sacrificial gate(s) 114 is below the top surface of an associated or physically connected fin 110. As such, an upper portion of fin(s) 110 may be exposed by the partial removal of sacrificial gates 114.

The removal of mask 112 and partial removal of sacrificial gates 114 may effectively form trench 126 defined by vertical spacers 116, sacrificial gates 114, and fins 110, as depicted.

Figure 8:
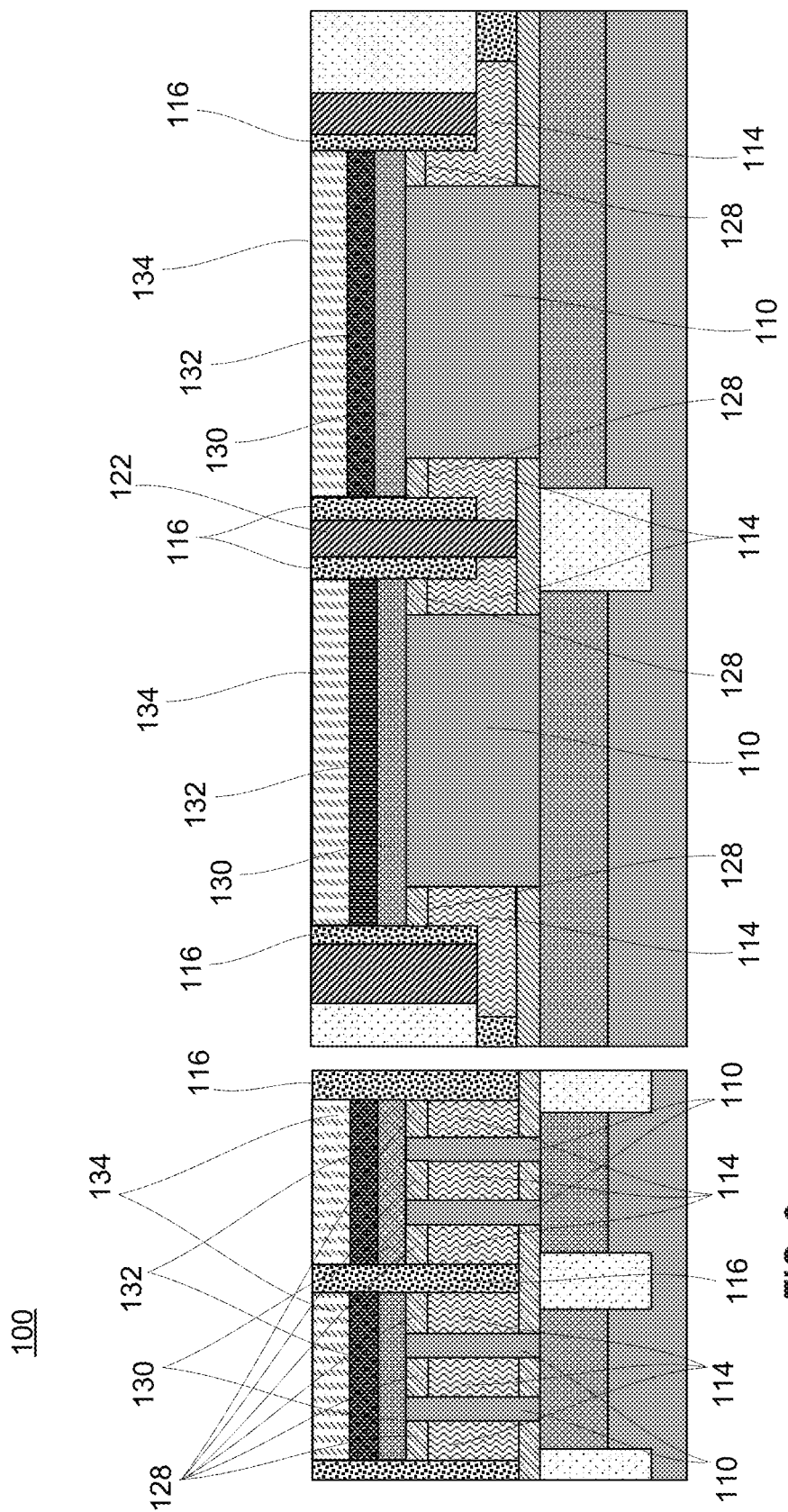

FIG. 8 depicts cross-sectional views of semiconductor structure 100 shown after a fabrication operation, in accordance with one or more embodiments. At the present fabrication operation, top spacers 128, top S/D region 130, top metallization 132, and top cap 134 are formed within trench 126.

Top spacer 128 may be formed by depositing a dielectric material by PVD, CVD, ALD, or the like. Exemplary top spacer 128 materials may be but are not limited to: SiN, SiBCN, SiOCN, SiOC, SiC, or the like.

Top spacer 128 may be formed within trench 126 upon the top surface of sacrificial gate 114, upon a portion of sidewall of vertical liner 116, and upon portion of a sidewall of fin 110. The upper surface of top spacer 128 may be substantially coplanar with the top surface of the associated or physically connected fin 110. Such coplanarity may be achieved by initially depositing (e.g., ALD) top spacer 128 material followed by isotropic etching back the top spacer 128 material such that excess top spacer 128 material is removed but for the top spacer 128 material within the cavity above the sacrificial gate 114 between fin 110 and vertical liner 116.

Top S/D region 130 may be formed by growing S/D epitaxy from the exposed top surface of fin 110, and doping such regions, as appropriate. Further, top S/D region 130 may be formed by lateral epitaxy growth extending over the top surface of top spacers 128. The top S/D regions 130 may be formed by epitaxially growing one layer and then the next until the desired number and desired thicknesses of such layers are achieved. Epitaxial materials can be grown from gaseous or liquid precursors. Epitaxial materials can be grown using VPE, MBE, LPE, or other suitable process. Epitaxial silicon, SiGe, and/or carbon SiC can be doped during deposition (in-situ doped) by adding dopants, n-type dopants (e.g., phosphorus or arsenic) or p-type dopants (e.g., boron or gallium), depending on its inclusion within associated pFET 10 or nFET 20. Exemplary top S/D region 130 materials may be but are not limited to: boron doped SiGe (or the like) for pFET 10 or phosphorous doped Si (or the like) for nFET 20.

Top metallization 132 may be formed within trench 126 upon the top surface of top S/D region 130. Top metallization 132 may be formed by depositing a silicide liner, followed by depositing a adhesion layer, and depositing conductive metal. Subsequently, top metallization 132 may be planarized by e.g., CMP, recess, or the like. Exemplary silicide liner material includes Ti, Ni, NiPt, or the like. Exemplary adhesion layer materials may be and are not limited to: TiN, TaN, or the like. Exemplary conductive metals may be and are not limited to: Co, W, Cu, Ru, or the like.

Top cap 134 may be formed within trench 126 upon the top surface of top metallization 132. Top cap 134 may be formed by depositing a dielectric material by PVD, CVD, ALD, or the like followed by CMP, recess, or the like. Exemplary top cap 134 materials may be but are not limited to: SiN, SiBCN, SiOCN, SiOC, SiC, or the like.

Figure 9:
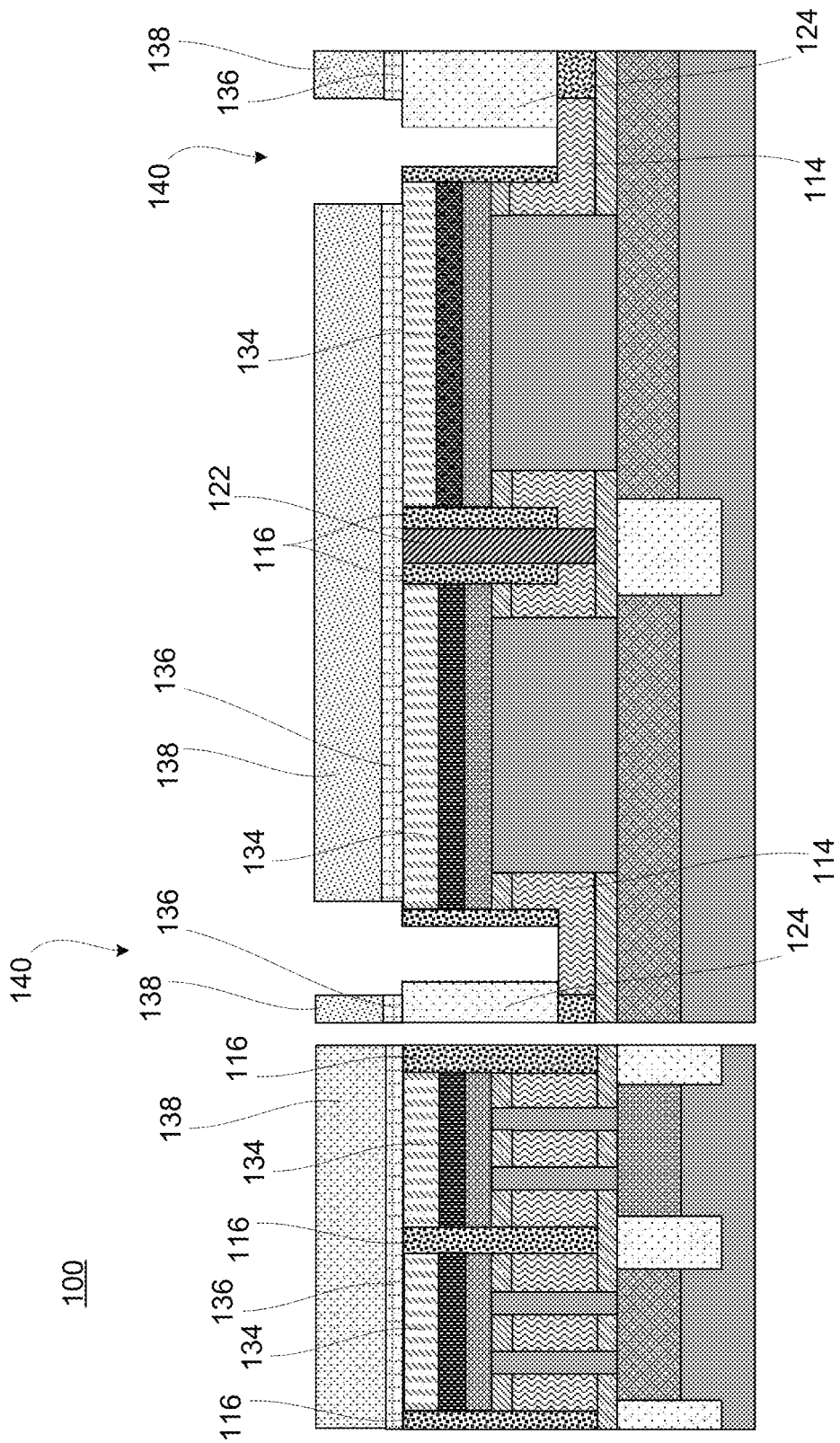

FIG. 9 depicts cross-sectional views of semiconductor structure 100 shown after a fabrication operation, in accordance with one or more embodiments. At the present fabrication operation, sacrificial spacer 122 is removed and replacement gate trench 140 is formed.

Replacement gate trench 140 may be patterned and sacrificial spacer 122 may be removed by initially forming mask layer(s) 136, 138 upon the upper surface of semiconductor structure 100. For example, mask layer 138 may be formed upon an upper mask 136. Subsequently, mask 136 may be etched to expose one or more respective upper surface portions of ILD 124, sacrificial spacer 122, vertical spacer 116, top cap 134, etc. Subsequently, the exposed sacrificial spacer 122 may be removed by known techniques so as to form replacement gate trench 140.

Mask layer 136 may be formed by depositing a dielectric material by PVD, CVD, ALD, or the like. Exemplary mask layer 136 materials may be but are not limited to: $SiO_2$, or the like. Mask layer 138 may be formed by spin-on coating a soft mask material, or the like. Exemplary mask layer 138 materials may be but are not limited to an OPL, or the like.

As indicated above, the mask layer(s) 136, 138 may be patterned utilizing known patterning and/or lithography techniques. Undesired portions of the mask layer(s) 136, 138 may be removed, thereby exposing the underlying sacrificial spacer(s) 122. Subsequently, known etching techniques may remove the exposed sacrificial spacer(s) 122 between ILD 124 and vertical spacer 116, thereby forming contact trench 140. Replacement gate trench 140 may expose at least a portion of the associated sacrificial gate 114.

Figure 10:
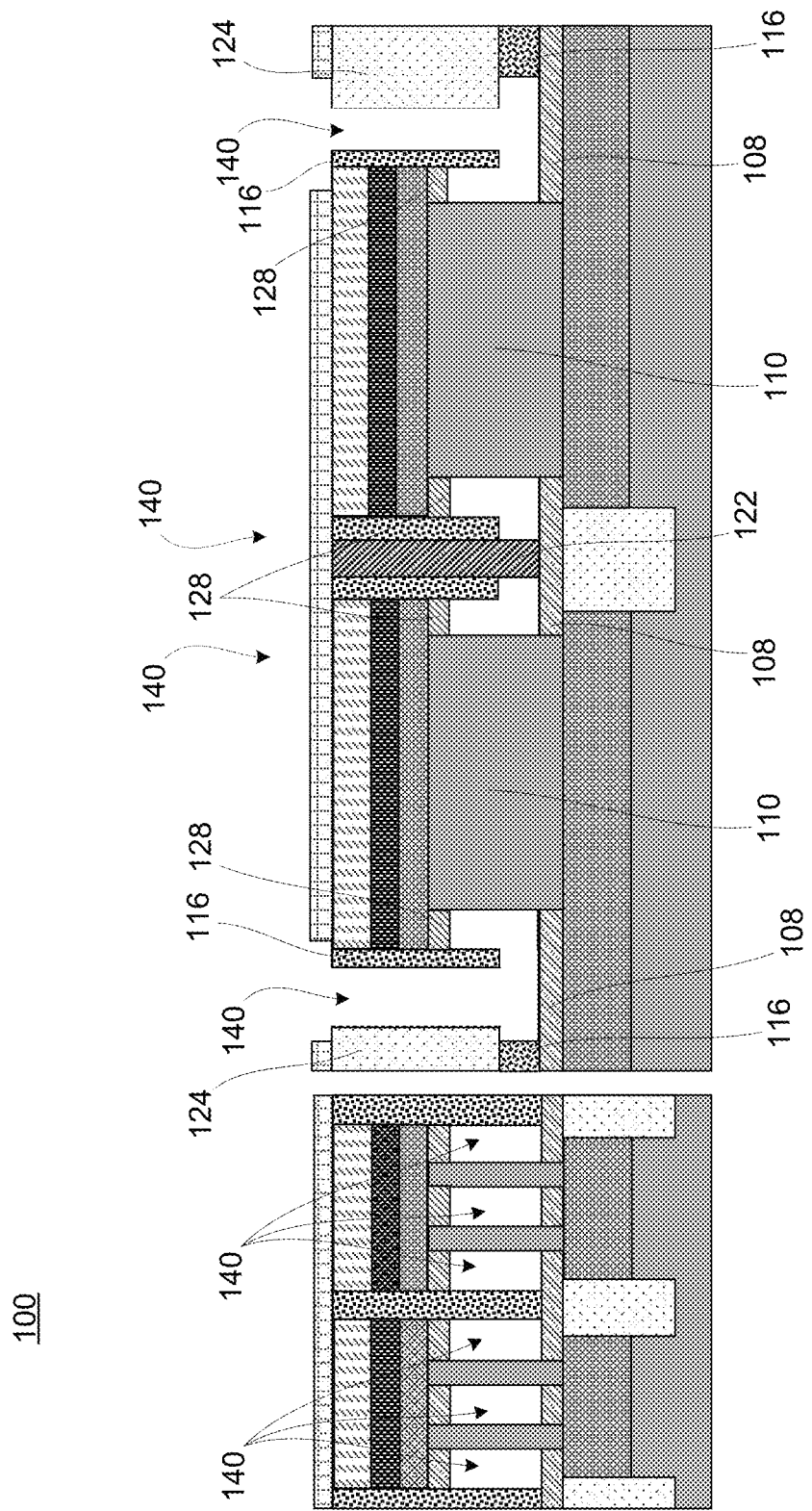

FIG. 10 depicts cross-sectional views of semiconductor structure 100 shown after a fabrication operation, in accordance with one or more embodiments. At the present fabrication operation, sacrificial gates 114 are removed through replacement gate trench 140, thereby exposing the vertical channel fin 110 sidewall or side surface between lower spacer 108 and upper spacer 128.

Sacrificial gates 114 may be removed by known etching techniques and may effectively further enlarge the associated replacement gate trench 140. Subsequently, the enlarged replacement gate trench 140 may expose at least a portion of a sidewall or side surface of one or more fins 110. For example, the enlarged replacement gate trench 140 may expose a sidewall or side surface of a fin 110 between bottom spacer 108 and top spacer 128.

Figure 11:
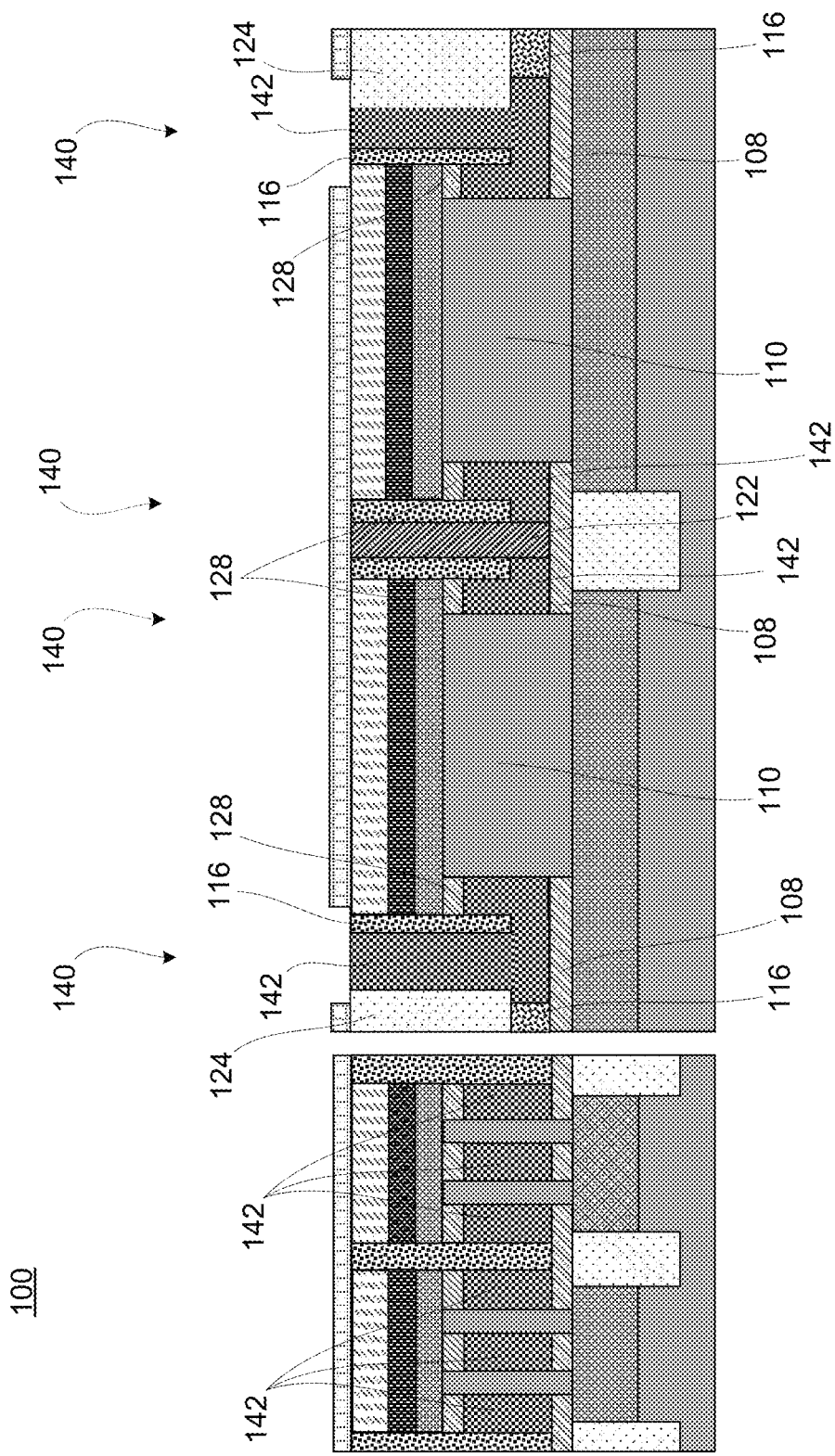

FIG. 11 depicts cross-sectional views of semiconductor structure 100 shown after a fabrication operation, in accordance with one or more embodiments. At the present fabrication operation, replacement gates 142 are formed within gate contact trench 140.

Replacement gate 142 may be formed by depositing a gate dielectric liner and depositing work function metals by PVD, CVD, ALD, or the like, within replacement gate trench 140. Exemplary gate dielectric materials may be but are not limited to: $SiO_2$, $HfO_2$, $ZrO_2$, $HfZrO_2$, HfAlOx, HfSiOx, or the like. Exemplary work function metal materials may be but are not limited to: TiN, TiC, TiAlC, TaN, or the like.

As is depicted in FIG. 11, sacrificial spacer 122 is retained between pFET 10 and nFET 20 and may effectively serve as a self-aligned block between pFET 10 and nFET 20, and may be referred hereinafter as self-aligned block 122. Self-aligned block may prevent replacement gate material, gate work function material, or the like from undesirably undercutting or otherwise migrating from one side of semiconductor structure 100 (e.g. from pFET 10) to another side of semiconductor structure 100 (e.g. to nFET 20), or vice versa. In some implementations, the self-aligned block 122 may allow for an overall thinner semiconductor structure.

Figure 12:
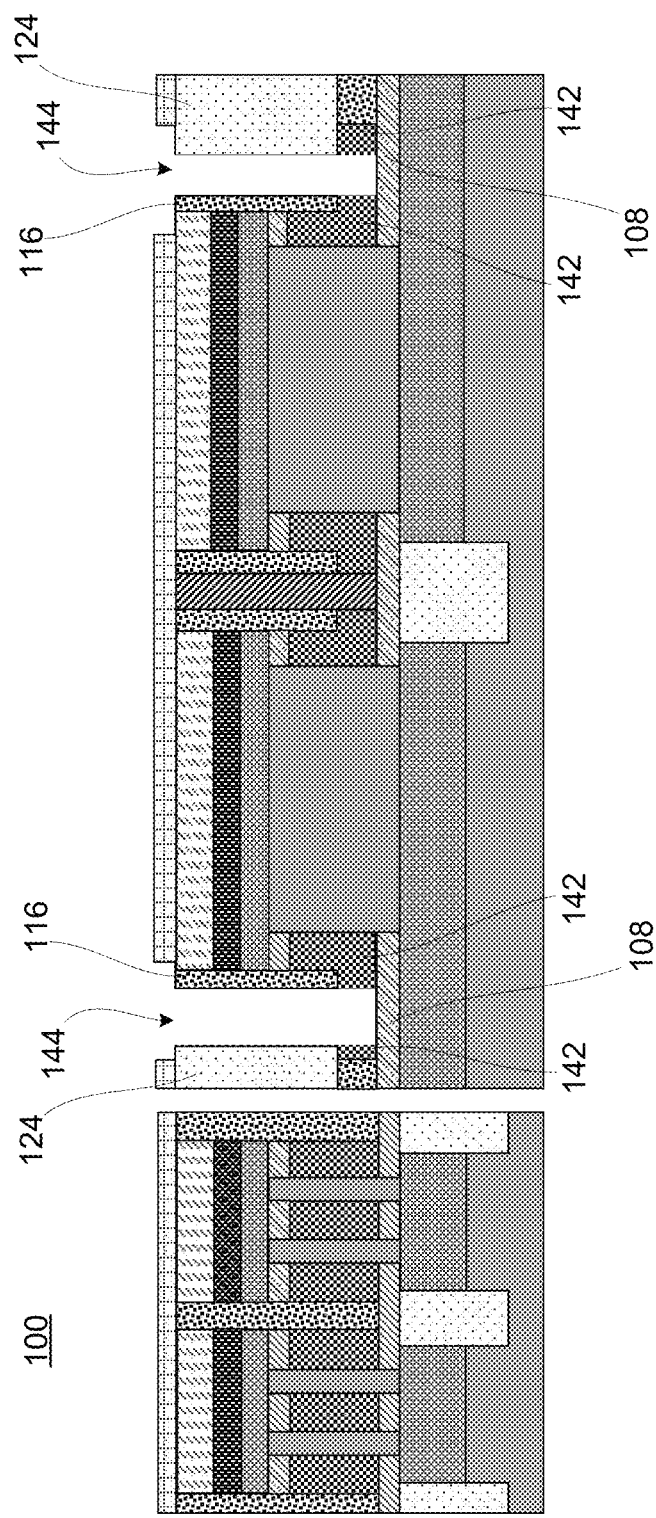

FIG. 12 depicts cross-sectional views of semiconductor structure 100 shown after a fabrication operation, in accordance with one or more embodiments. At the present fabrication operation, portions of replacement gates 142 are removed and contact trench 144 is formed.

Portions of replacement gate 142 may be removed by known etching techniques. For example, portions of replacement gate 142 may be removed by an reactive ion etch (ME) that is self-aligned between ILD 124 and the facing sidewall of vertical spacer 116. The removal of such portion of replacement gate 142 may expose a portion of the top surface of the underlying bottom spacer 108.

Figure 13:
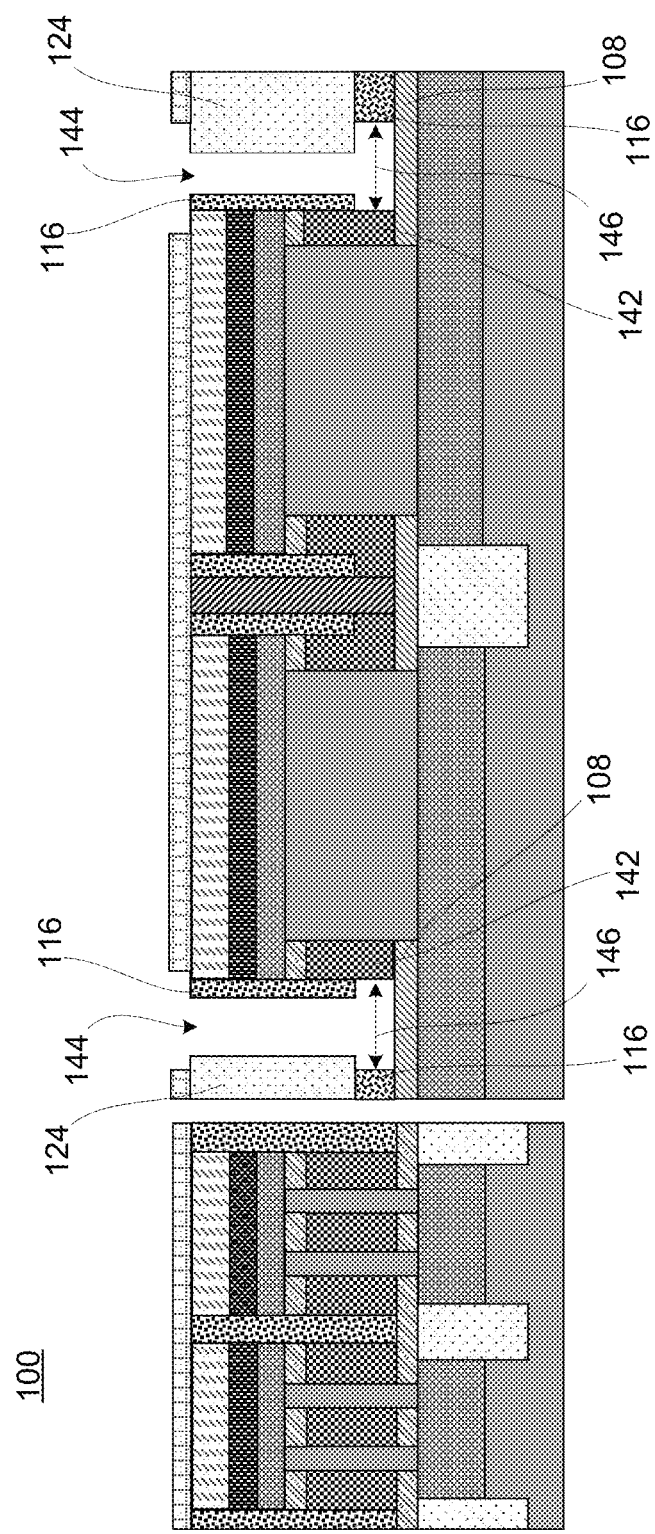

FIG. 13 depicts cross-sectional views of semiconductor structure 100 shown after a fabrication operation, in accordance with one or more embodiments. At the present fabrication operation, contact trench 144 is enlarged laterally to form gate stack indentation 146.

Gate stack indentation 146 may be formed by removing further portions of replacement gate 142 through contact trench 144. Removal of such portions of replacement gate 142 may be accomplished by known etching techniques. The formation of gate stack indentation 146 may expose at least a portion of the side surface of spacer 116 (if present) or a portion of ILD 124 (if spacer 116 is not present). In some embodiments, a sidewall of the remaining replacement gate 142 may be substantially coplanar with an inset sidewall (sidewall facing self-aligned block 122). Gate stack indentation 146 may expose a further portion of the top surface of the underlying bottom spacer 108; may expose a portion of the bottom surface of ILD 124; and may expose at least a portion of the bottom surface of vertical liner 116. Subsequent to gate stack indentation 146 formation, exposed gate dielectric liner material can also be selectively removed.

Figure 14:
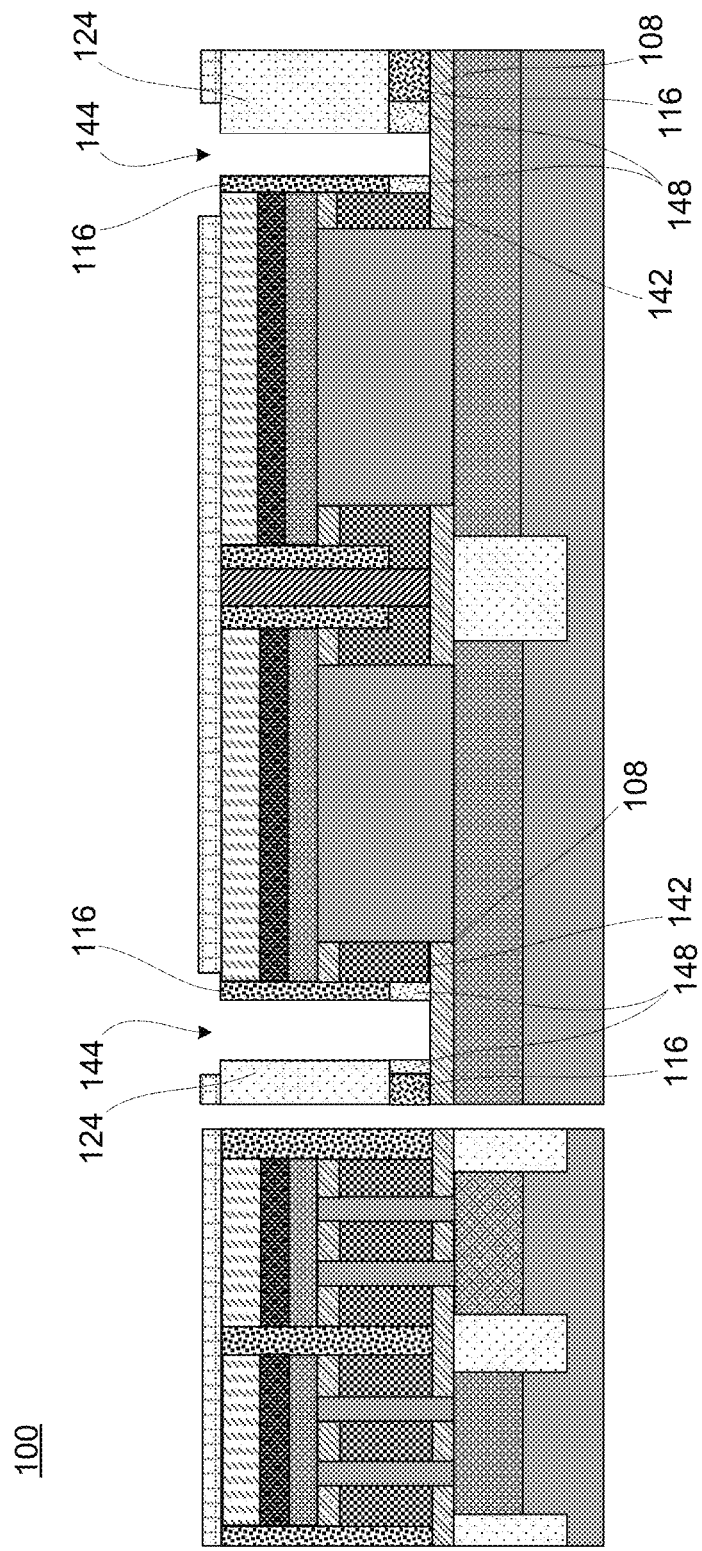

FIG. 14 depicts cross-sectional views of semiconductor structure 100 shown after a fabrication operation, in accordance with one or more embodiments. At the present fabrication operation, inner spacer 148 is formed within the gate stack indentation 146.

Inner spacer 148 may be formed by depositing a dielectric material by PVD, CVD, ALD, or the like, within contact trench 144 and further within gate stack indentation 146. Exemplary inner spacer 148 materials may be but are not limited to: SiN, SiBCN, SiOCN, SiOC, or the like.

In some embodiments, an inner spacer 148 may be formed upon the top surface of bottom spacer, upon a sidewall of liner 116, and upon a portion of the bottom surface of ILD 124. A sidewall of this inner spacer 148 may be coplanar with a sidewall of ILD 124, as depicted. In some embodiments, another inner spacer 148 may be formed upon the top surface of bottom spacer, upon a portion of a sidewall of replacement gate 142, and upon at least a portion of the bottom surface of vertical liner 116. A sidewall of this inner spacer 148 may be coplanar with a sidewall of vertical liner 116, as depicted.

Figure 15:
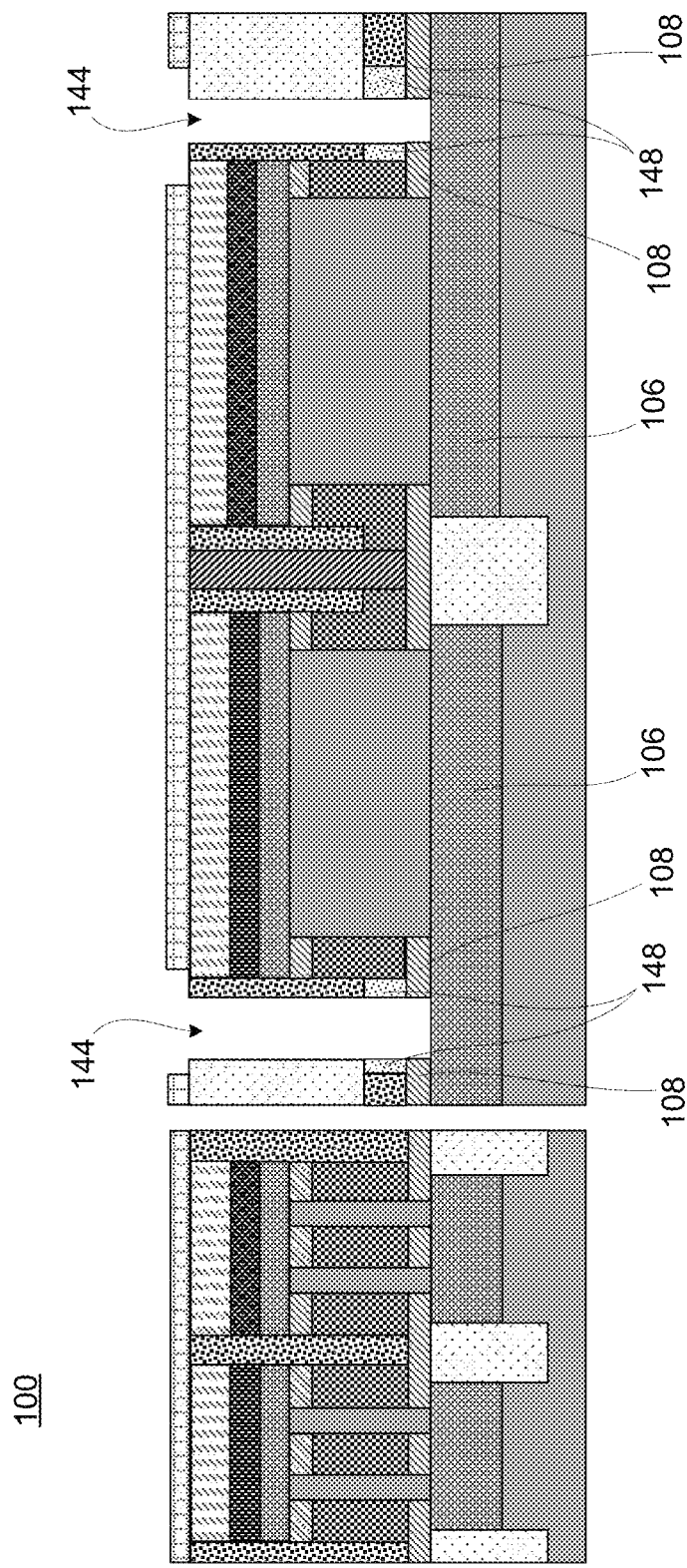

FIG. 15 depicts cross-sectional views of semiconductor structure 100 shown after a fabrication operation, in accordance with one or more embodiments. At the present fabrication operation, a portion of bottom S/D region 106 is exposed by punching through bottom spacer 108 through contact trench 144.

The portion of bottom spacer 108 that is exposed by contact trench 144 may be removed by known etching techniques or by known punch through techniques. Subsequently, the contact trench 144 may expose at least a portion of the bottom S/D region 106. For example, the contact trench 144 may expose a portion of the top surface of S/D region 106.

Figure 16:
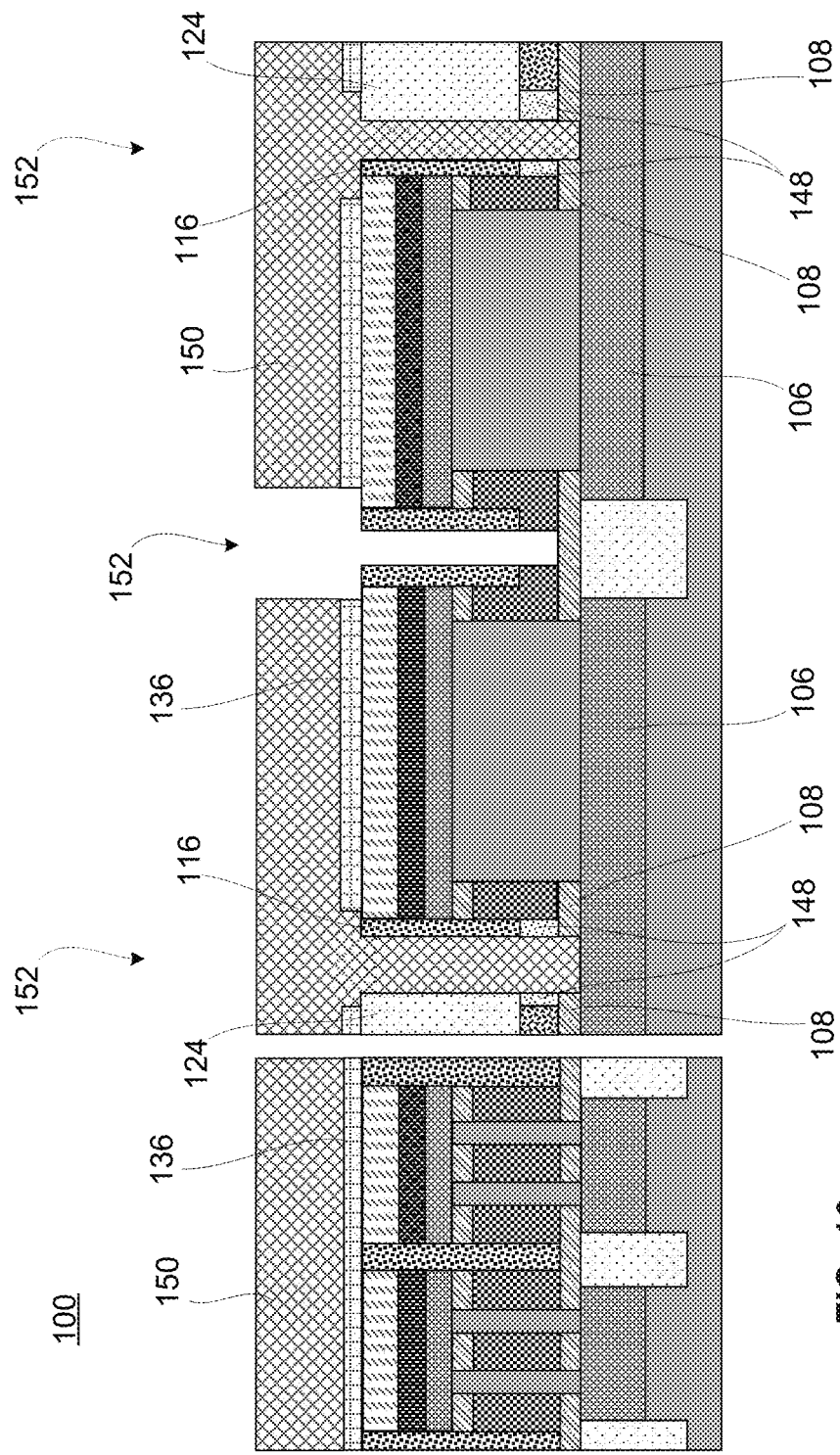

FIG. 16 depicts cross-sectional views of semiconductor structure 100 shown after a fabrication operation, in accordance with one or more embodiments. At the present fabrication operation, self-aligned block 122 is removed and gate contact trenches 152 are formed.

Self-aligned block 122 may be removed by initially forming a mask layer 150. The mask layer 150 may be formed by depositing a soft mask material by spin-on coating, or the like. Exemplary mask layer 150 materials may be but are not limited to OPL, or the like. In particular embodiments, the mask layer 150 may be formed upon mask layer 136 and upon exposed structure 100 surfaces within contact trench 144, as depicted.

Undesired portions of mask layer 150 and/or mask layer 136 may be removed by known etching or patterning techniques. For example, a first undesired portion of mask layer 150 and mask layer 136 may be removed to expose the underlying self-aligned block 122. Subsequently, the exposed self-aligned block 122 may be removed, as depicted. The exposing and removal of self-aligned block 122 may form a first gate contact trench 152 in the region between pFET 10 and nFET 20, as depicted. Subsequently, mask layer 150 can be ashed to prepare contact trench(es) 152 to bottom S/D region 106 and gate contact trench(es) 152 in the region between pFET 10 and nFET 20 to replacement gate 142 for contact metallization formation.

The gate contact trench 152, in the region between pFET 10 and nFET 20, may expose respective facing vertical sidewalls of a pFET 10 vertical liner 116 and a nFET 20 vertical liner 116; may expose respective facing vertical sidewalls of a pFET 10 replacement gate 142 and a nFET 20 replacement gate 142; and/or may expose a portion of a top surface of spacer 108 between pFET 10 and nFET 20.

A pFET 10 contact trench 152 may expose a vertical sidewall of a pFET 10 vertical liner 116; may expose respective facing vertical sidewalls of a pFET 10 inner spacer 148; may expose respective facing vertical sidewalls of a pFET 10 spacer 108; may expose a vertical sidewall of a pFET 10 ILD 124.

A nFET 20 contact trench 152 may expose a vertical sidewall of a nFET 20 vertical liner 116; may expose respective facing vertical sidewalls of a nFET 20 inner spacer 148; may expose respective facing vertical sidewalls of a nFET 20 spacer 108; may expose a vertical sidewall of a nFET 20 ILD 124.

Figure 17:
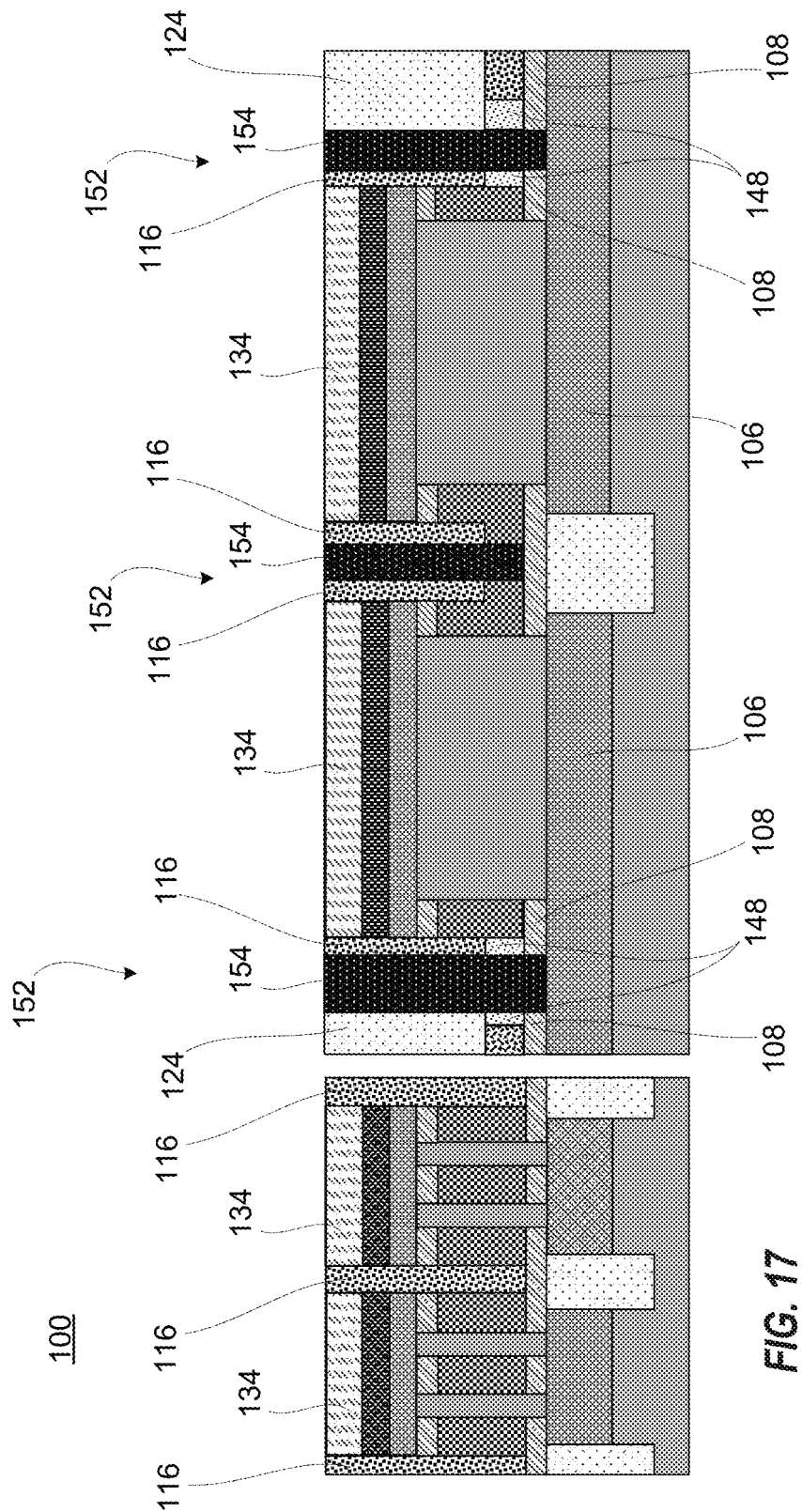

FIG. 17 depicts cross-sectional views of semiconductor structure 100 shown after a fabrication operation, in accordance with one or more embodiments. At the present fabrication operation, contact metallization 154 is formed within contact metallization trench 152.

Contact metallization 154 may be formed within metallization trench 152 upon the exposed surfaces therein. Contact metallization 154 may be formed by depositing a silicide liner by RFPVD or ALD, such as Ti, Ni. NiPt, or the like, followed by ALD deposition of adhesion layer, such as TiN, followed by conductive metal dep by PVD, CVD, ALD or plating, such as Co, W, Ru, Cu, or the like. Subsequent to the present fabrication stage, the top surface of semiconductor structure 100 may be planarized by a CMP, or the like.

Figure 18:
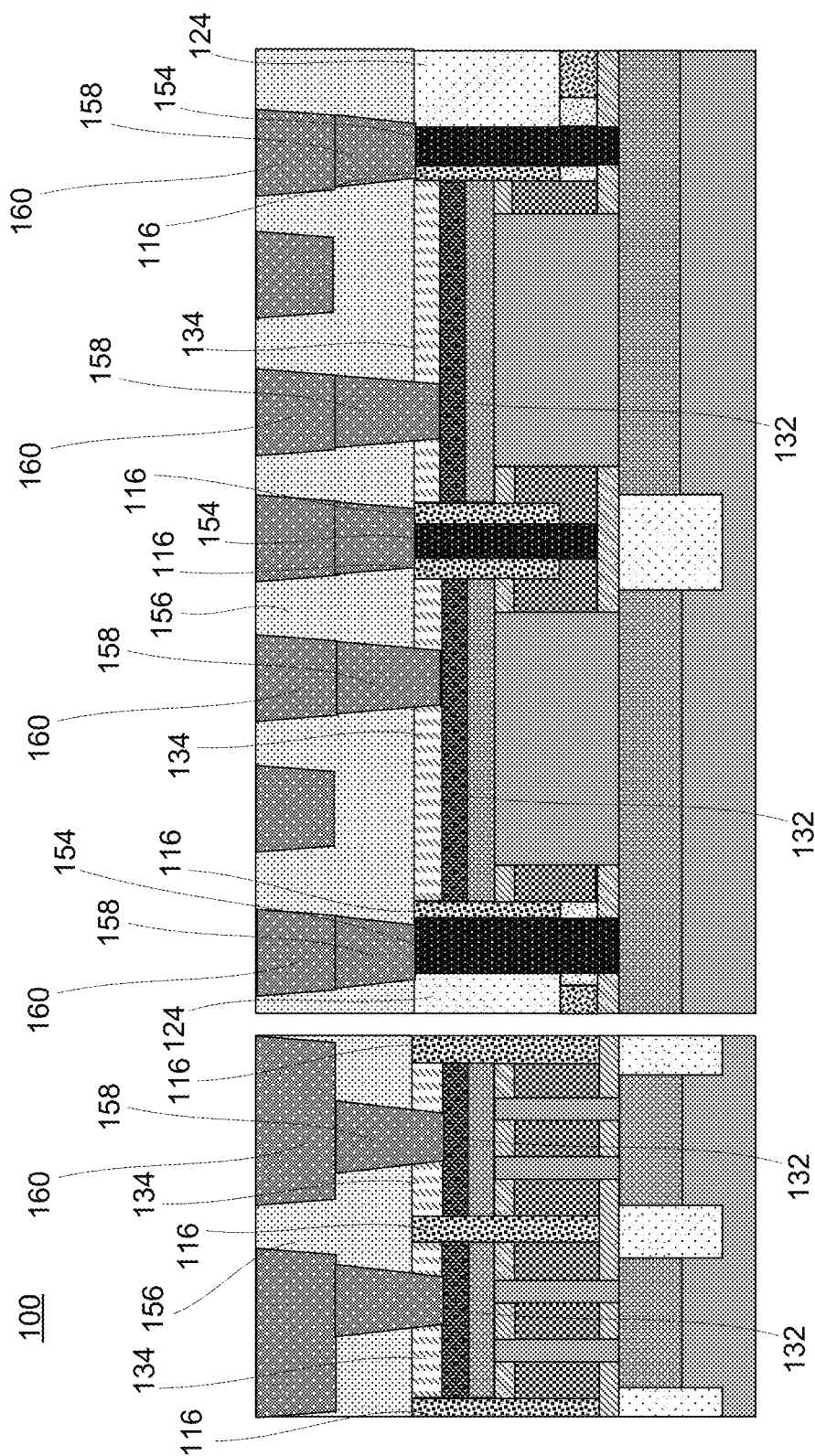

FIG. 18 depicts cross-sectional views of semiconductor structure 100 shown after a fabrication operation, in accordance with one or more embodiments. At the present fabrication operation, back end of line (BEOL) dielectric layer(s) 156 are formed and BEOL wiring, such as vertical interconnect access (VIA) 158, and wiring line 160, are formed within BEOL dielectric layer 156.

BEOL dielectric layer(s) 156 may be formed by depositing one or more dielectric material(s) by PVD, CVD, ALD, or the like. BEOL dielectric layer(s) 156 can have a thickness of from about 40 nm to about 200 nm, although other thicknesses are within the contemplated scope. Exemplary BEOL dielectric layer(s) 156 material(s) may be but are not limited to: low-k dielectric with k value<3.9. In particular embodiments, the BEOL dielectric layer(s) 156 may be formed upon the exposed upper surface structure 100 surfaces, as depicted. BEOL metal lines 160 trenches and VIA 158 trenches can be formed by known pattering and lithography processes with subsequent conductive metal line 160 and VIA 158 formation therein (e.g., utilizing conventional damascene or dual damascene process, or the like).

For clarity, as is depicted in FIG. 18, semiconductor structure 100 may include a first spacer liner (e.g., vertical liner 116) and second spacer liner (e.g., inner spacer 148) between the bottom S/D region 106 and top metallization 132. Further, semiconductor structure 100 may include a third spacer liner (e.g., vertical liner 116) between the gate 142, contact metallization 154 and top metallization 132. Further, semiconductor structure 100 may include two types of liners near the bottom of the bottom S/D contact metallization 154 (e.g. bottom spacer 108, inner spacer 148, etc.). Further, semiconductor structure 100 may include a spacer liner (e.g. bottom spacer 108) that extends and physically separates bottom S/D contact metallization 154 from the channel fin 110. Further, semiconductor structure 100 may include a spacer liner (e.g. spacer 148) on both sides of bottom S/D contact metallization 154 where on side of that spacer liner is physically between S/D contact metallization 154 and replacement gate 142. Further, semiconductor structure 100 may include facing "L" shaped gates 142 associated with the same gate contact metallization 154 (e.g. spacer 148) on both opposing sides of bottom S/D contact metallization 154. Further, semiconductor structure 100 may include a spacer liner (e.g. vertical liner 116) on both sides of bottom gate 142 contact metallization 154. Further, the top surface of top metallization 132 may be below the top surface(s) of contact metallization(s) 154.

Figure 19:
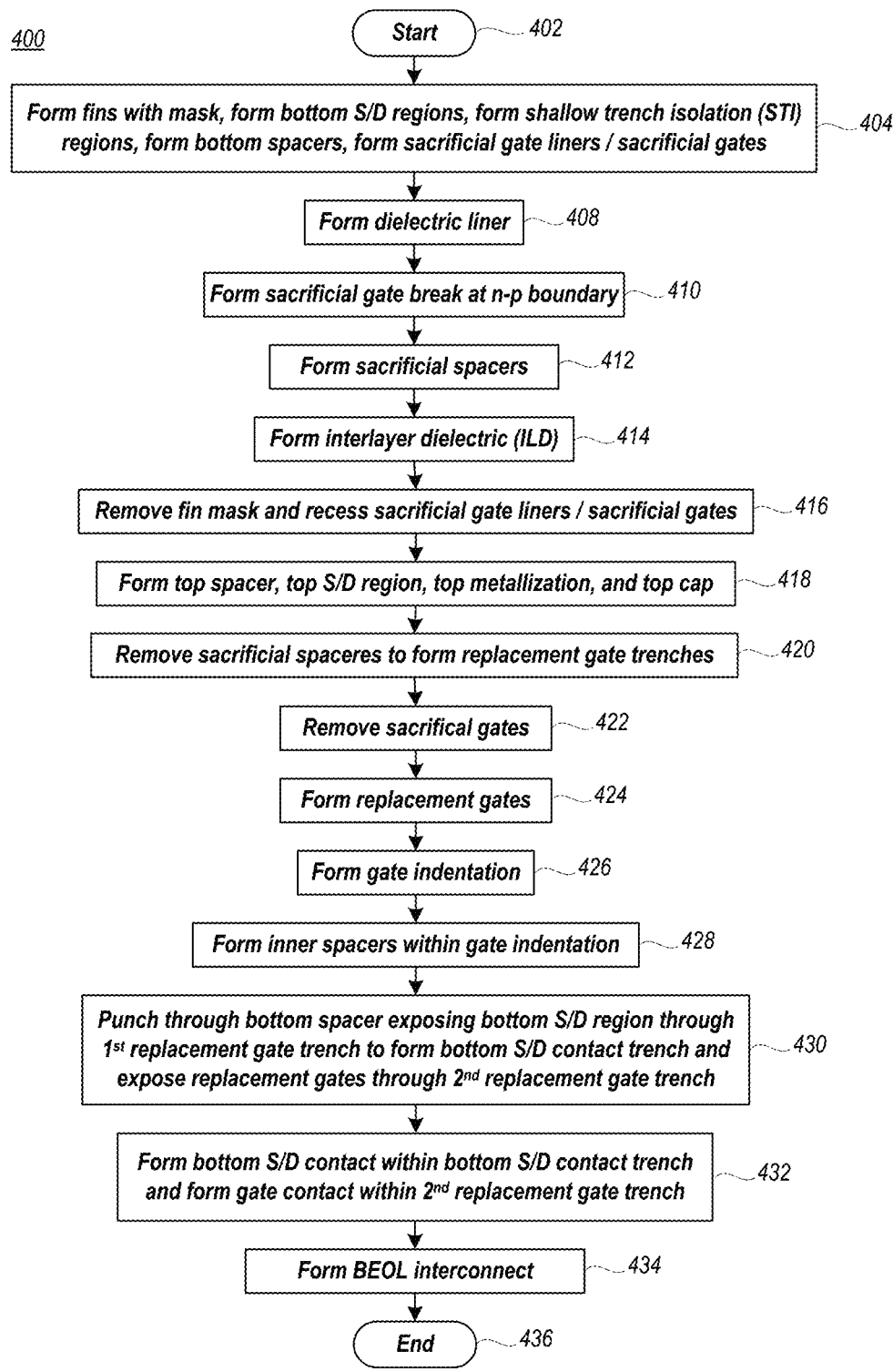
FIG. 19 is a flow diagram illustrating a semiconductor device fabrication method, in accordance with one or more embodiments.

FIG. 19 is a flow diagram illustrating a semiconductor device 100 fabrication method 400, in accordance with one or more embodiments. Method 400 may begin at block 402 and continue at block 404 with forming channel fins 110, with fin mask 112 thereupon, upon a substrate 102, with forming bottom S/D region(s) 106 within or upon substrate 102, with forming STI region(s) 104 within or upon substrate 102 between bottom S/D region(s) 106, with forming bottom spacer(s) 108 upon the bottom S/D regions 106 and upon STI region(s) 104, with forming one or more sacrificial gate structures, such as a sacrificial gate liner, sacrificial gates 114, or the like upon the bottom spacers 108 and upon respective sidewall(s) of the channel fins 110 and mask 112.

Method 400 may continue with forming dielectric liner layer 116' and retaining vertical liners 116 upon the sidewalls of sacrificial gates 114 (block 408). Method 400 may continue with forming sacrificial spacer trenches 120, 121 within a mask 118 to expose a portion of sacrificial gates 114, thereby forming a sacrificial gate break at the pFET 10 and nFET 20 boundary (block 410) and forming sacrificial spacer(s) 122 upon the sacrificial gate(s) 114 within sacrificial spacer trenches 120, 121 (block 412).

Method 400 may continue with forming ILD portions 124 (block 414) and removing mask 112 and partially recessing the one or more sacrificial gate structures (block 416). Method 400 may continue with forming top spacer 128 upon the sacrificial gate 114 between vertical liner 116 and channel fin 110, with forming top S/D region 130 upon top spacer 128 and upon the channel fins 110, with forming top metallization 132 upon top S/D region 130 between facing vertical liners 116, and with forming cap 134 upon the top metallization 132 between facing vertical liners 116 (block 418).

Method 400 may continue with removing one or more sacrificial spacers 122 within pFET 10 and/or within nFET 20 while retaining a sacrificial spacer 122 in the region between pFET 10 and nFET 20. The retained sacrificial spacer 122 may be referred to as self-aligned block 122. The removal of such sacrificial spacers 122 may form replacement gate trench 140 which may expose a portion of an associated sacrificial gate 114. (block 420). Subsequently, sacrificial gate 114 may be removed through the replacement gate trench 140 (block 422) and replacement gate 142 may be formed therein, in place of the removed sacrificial gates 114 (block 424).

Method 400 may continue with re-forming replacement gate trench 140 (e.g., form contact trench 144) and forming gate stack indentation 146 between facing vertical liners 116 within the contact trench (block 426) and forming inner spacers 148 within the gate indentation 146 (block 428). Method 400 may continue with exposing a portion of the bottom S/D region 106 by removing or punching through a portion of the bottom spacer 108 to form a bottom S/D contact trench 144 and exposing a portion of the replacement gates 142 by removing the sacrificial block 122 to form metallization trench 152 (block 430).

Method 400 may continue with forming a S/D contact metallization 154 within the S/D contact trench 144 and with forming a gate contact metallization 154 within metallization trench 152 (block 432). Method 400 may continue, at block 434, with forming BEOL interconnect(s). For example, BEOL layer(s) 156 may be formed and BEOL wiring (e.g., VIA 158, wiring 160, or the like) may be formed within BEOL layer(s) 156. Method 400 may end at block 436.

Figure 20:
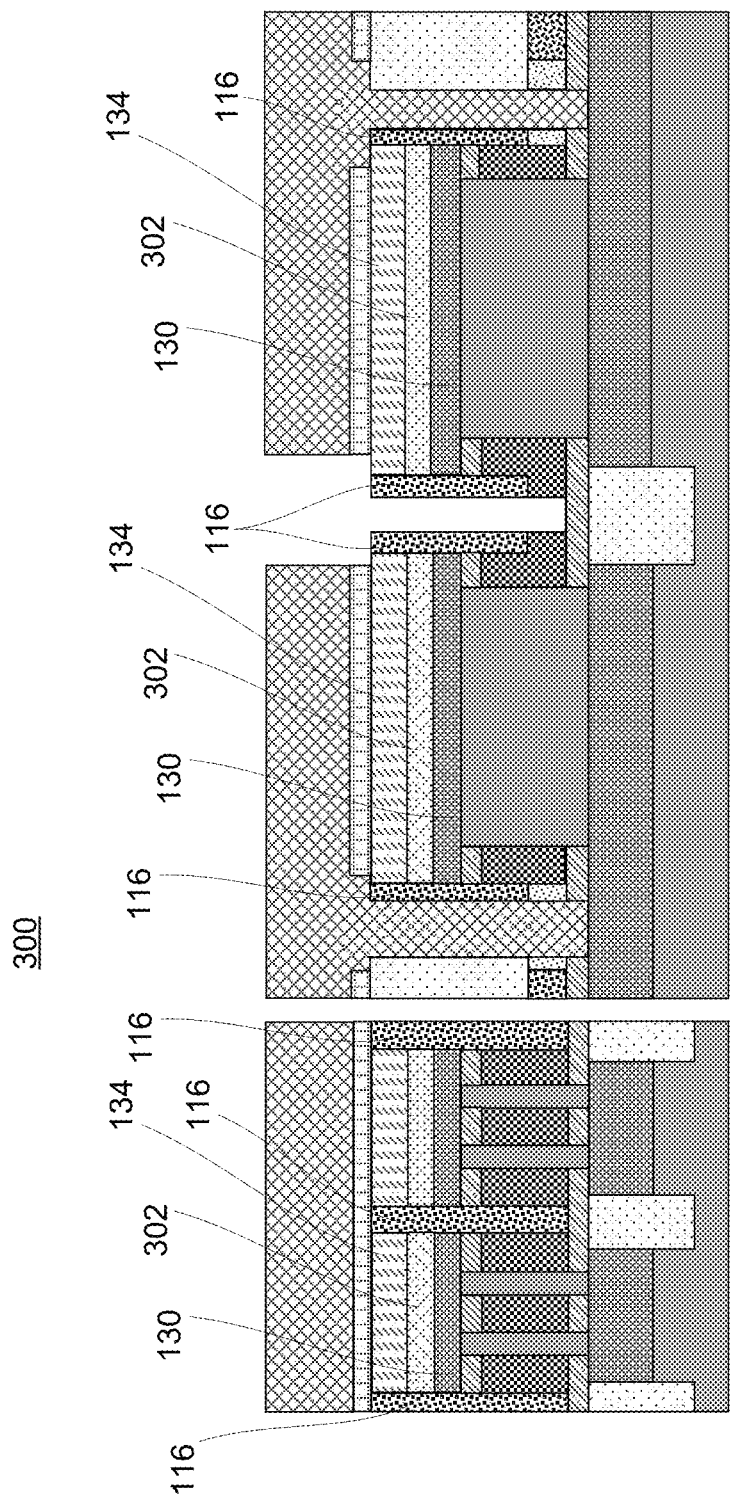
FIG. 20 and FIG. 21 depicts cross-sectional views of a semiconductor structure shown after fabrication operations, in accordance with one or more embodiments.
Figure 21:
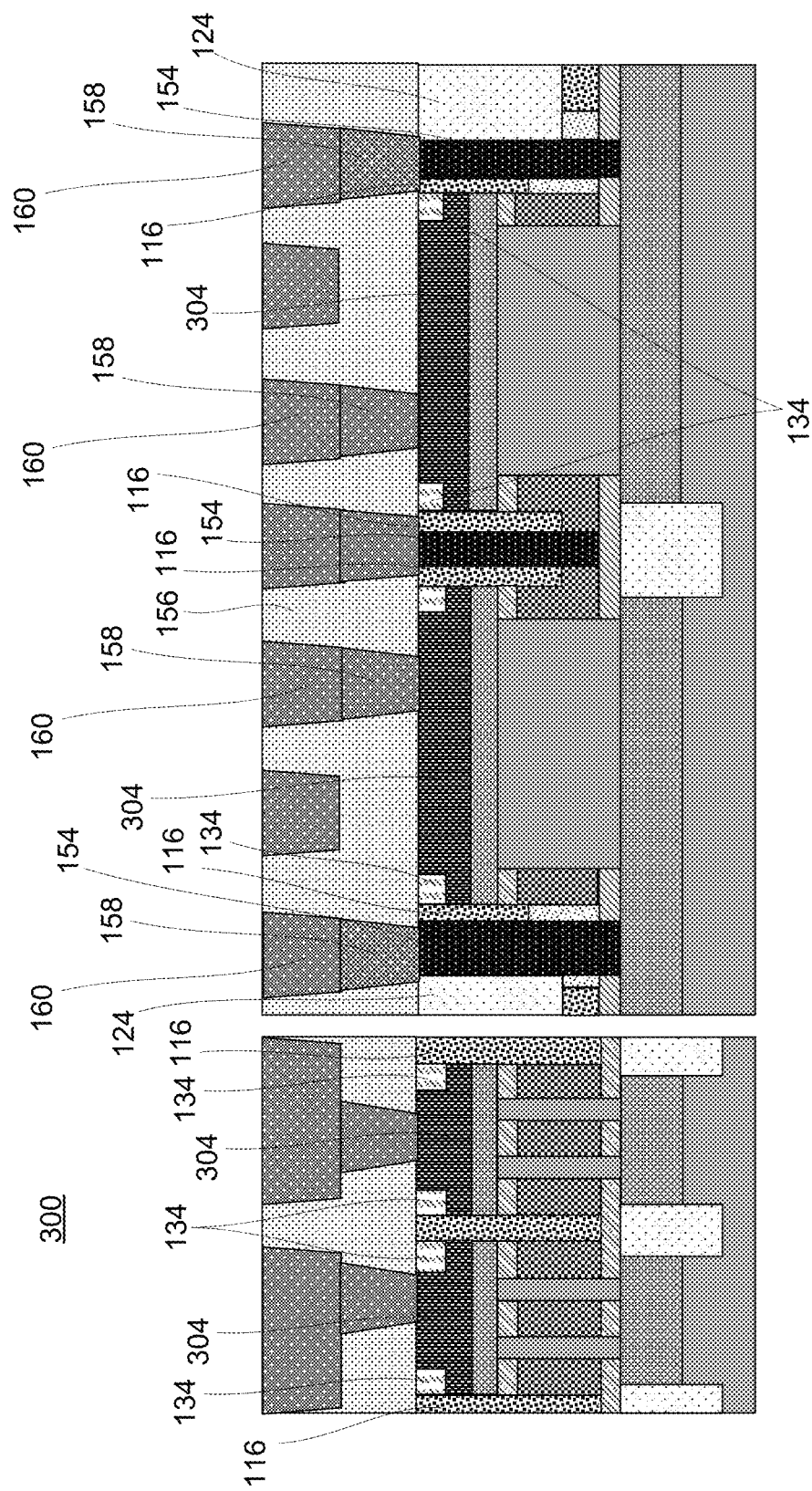

FIGS. 20 and 21 depicts cross-sectional views of semiconductor device or structure 300 shown after fabrication operations, in accordance with one or more embodiments. Semiconductor structure 300 may be fabricated utilizing similar fabrication stages relative to semiconductor structure 100. Semiconductor structure 300 depicts an alternative embodiment in which top metallization 304 may be formed with contacts 154.

As depicted, in the present embodiment due to the previous presence and subsequent removal of a sacrificial layer 302 that is formed upon the top S/D region 130, semiconductor structure 300 may include an upside down "T" shaped top metallization 304 that may be formed along with contacts 154. As described above, the top metallization 304 may be simultaneously formed with contact metallization 154 subsequent to the exposure and removal of the sacrificial layer 302. As depicted, one or more portions of cap 134 that contact vertical liner 116 may be retained. As such, one or more portions of top metallization 304 may be directly under such retained portions of cap 134. An upper surface of the top metallization 304 may be coplanar with the respective top surface(s) of such retained portions of cap 134. Further, utilizing such methodology may allow for the formation of VIAs 158 with coplanar lower surfaces (e.g., the top surface of top metallization 304 may be coplanar with the top surface of contact metallization 154). Even further, top metallization 304 may have a relatively larger top surface area that may increase the likelihood of successful VIA 158 formation and physical contact thereto.

Figure 22:
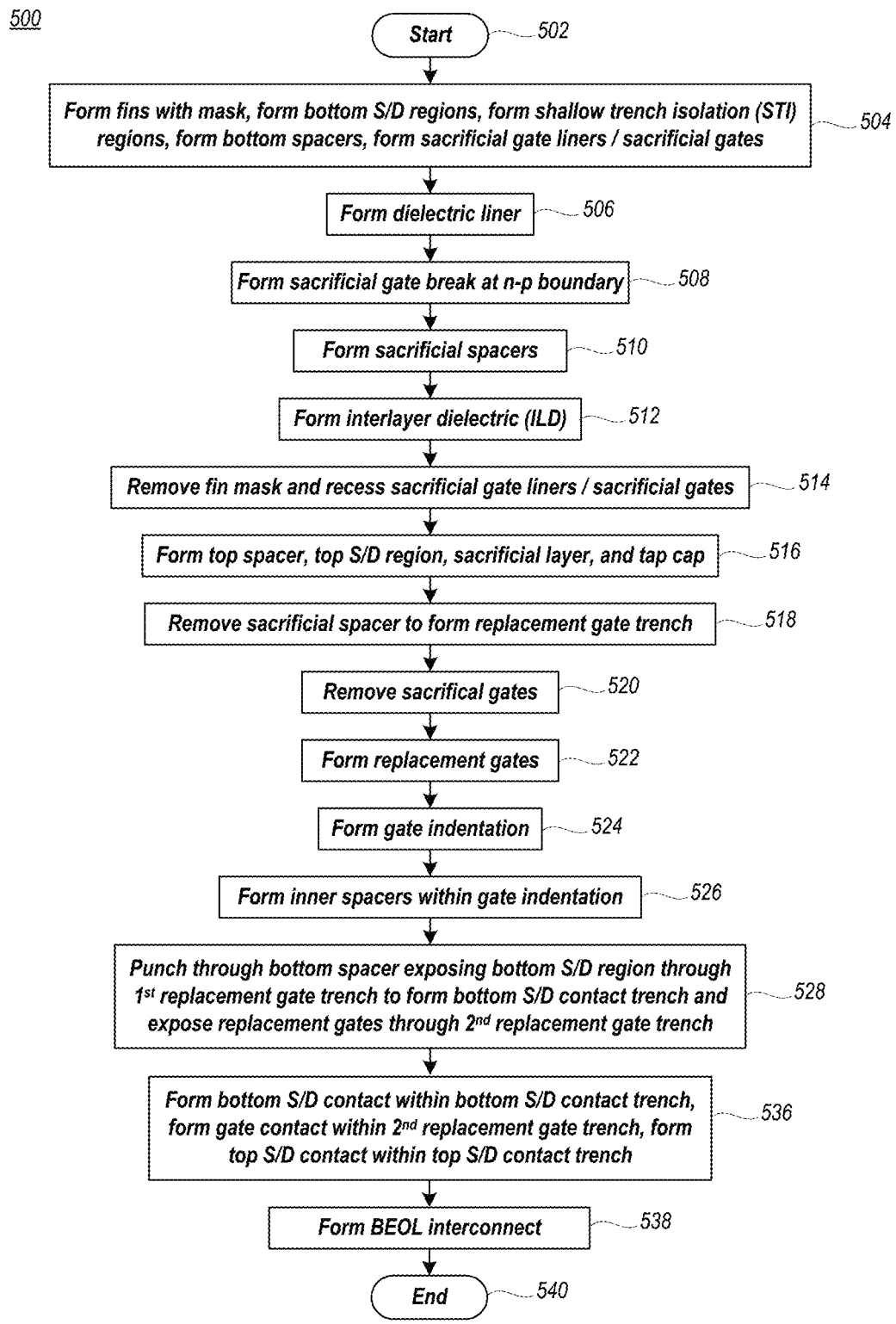
FIG. 22 is a flow diagram illustrating a semiconductor device fabrication method, in accordance with one or more embodiments.

FIG. 22 is a flow diagram illustrating a semiconductor device 300 fabrication method 500, in accordance with one or more embodiments. Method 500 may begin at block 502 and continue at block 504 with forming channel fins 110, with fin mask 112 thereupon, upon a substrate 102, with forming bottom S/D region(s) 106 within or upon substrate 102, with forming STI region(s) 104 within or upon substrate 102 between bottom S/D region(s) 106, with forming bottom spacer(s) 108 upon the bottom S/D regions 106 and upon STI region(s) 104, with forming one or more sacrificial gate structures, such as a sacrificial gate liner, sacrificial gates 114, or the like upon the bottom spacers 108 and upon respective sidewall(s) of the channel fins 110 and mask 112.

Method 500 may continue with forming dielectric liner layer 116' and retaining vertical liners 116, therefrom, located upon the sidewalls of sacrificial gates 114 (block 506). Method 500 may continue with forming sacrificial spacer trenches 120, 121 within a trench mask 118 to expose a portion of sacrificial gates 114 there below, thereby forming a sacrificial gate break at the pFET 10 and nFET 20 boundary (block 508). Method 500 may continue with forming sacrificial spacer(s) 122 upon the sacrificial gate(s) 114 within sacrificial spacer trenches 120, 121 (block 510).

Method 500 may continue with forming ILD portions 124 (block 512) and removing fin mask 112 and partially recessing the one or more sacrificial gate structures (block 514). Method 500 may continue with forming top spacer 128 upon the sacrificial gate 114 between vertical liner 116 and channel fin 110, with forming top S/D region 130 upon top spacer 128 and upon the channel fins 110, with forming sacrificial spacer 302 upon top S/D region 130 between facing vertical liners 116, and with forming cap 134 upon the sacrificial spacer 302 between facing vertical liners 116 (block 516).

Method 500 may continue with removing one or more sacrificial spacers 122 within pFET 10 and/or within nFET 20 while retaining a sacrificial spacer 122 in the region between pFET 10 and nFET 20. The retained sacrificial spacer 122 may be referred to as self-aligned block 122. The removal of such sacrificial spacers 122 may form replacement gate trench 140 which may expose a portion of an associated sacrificial gate 114. (block 518). Subsequently, sacrificial gate 114 may be removed through the replacement gate trench 140 (block 520) and replacement gate 142 may be formed therein, in place of the removed sacrificial gates 114 (block 522).

Method 500 may continue with re-forming replacement gate trench 140 (e.g., form trench 144) and forming gate indentation 146 between facing vertical liners 116 within the replacement gate trench 140 (block 524) and forming inner spacers 148 within the gate indentation 146 (block 526).

Method 500 may continue with exposing a portion of the bottom S/D region 106 by removing or punching through a portion of the bottom spacer 108 to form a bottom S/D contact trench 144, with exposing a portion of the replacement gates 142 by removing the sacrificial block 122 to form metallization trench 152, and with exposing the top S/D region 130 by removing the sacrificial layer 304 and by partially removing top cap 134 thereby forming a top S/D region trench (block 528).

Method 500 may continue with forming contact metallization 154 within a bottom S/D contact trench 144, with forming contact metallization 154 within metallization trench 152, and with forming top metallization 304 within the top S/D region trench (block 536). Method 500 may continue, at block 538, with forming BEOL interconnect(s). For example, BEOL layer(s) 156 may be formed and BEOL wiring (e.g., VIA 158, wiring 160, or the like) may be formed within BEOL layer(s) 156. Method 500 may end at block 540.

The method flow diagrams depicted herein are exemplary. There can be many variations to the diagrams or operations described therein without departing from the spirit of the embodiments. For instance, the operations can be performed in a differing order, or operations can be added, deleted or modified. All of these variations are considered a part of applicable claimed embodiments.

The descriptions of the various embodiments of the present invention have been presented for purposes of illustration but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A semiconductor device comprising:
    a channel fin between a bottom source/drain (S/D) region and a top S/D region;
    a gate around the channel fin, the gate comprising a first gate portion directly connected to a first side of the channel fin and a second gate portion directly connected to a second side of the channel fin, the first gate portion comprising a first sidewall and a second sidewall, and the second gate portion comprising a third sidewall;
    a top metallization upon the top S/D region;
    a first contact metallization connected to the first sidewall of the gate;
    a second contact metallization connected to the bottom S/D region;
    a vertical liner comprising a first vertical liner portion directly connected to at least the second sidewall of the gate and directly connected to a sidewall of the first contact metallization and a second vertical liner portion directly connected to at least the third sidewall of the gate and directly connected to a sidewall of the second contact metallization; and
    a top spacer between the gate and the top S/D region and in direct contact with the channel fin, the top spacer comprising a first sidewall that is in direct contact with the first vertical liner portion and a second sidewall that is in direct contact with the second vertical liner portion.

2. The semiconductor device of claim 1, further comprising:
an inner spacer below the second vertical liner portion and that is directly connected the third sidewall of the gate and that is directly connected to the sidewall of the second contact metallization.

3. The semiconductor device of claim 2, further comprising:
a bottom spacer below the inner spacer, between the second contact metallization and the channel fin, and between the gate and the bottom S/D region.

4. The semiconductor device of claim 1, wherein a top surface of top metallization is below a top surface of the first contact metallization and is below a top surface of the second contact metallization.

5. The semiconductor device of claim 1, wherein respective sidewalls of the top S/D region directly contact the first vertical liner portion and the second vertical liner portion.

6. The semiconductor device of claim 1, wherein respective sidewalls of the top metallization directly contact the first vertical liner portion and the second vertical liner portion.

7. The semiconductor device of claim 1, wherein a top surface of the vertical liner is coplanar with a top surface of the first contact metallization and is coplanar with a top surface of the second contact metallization.

8. A semiconductor device comprising:
a pFET comprising: a pFET channel fin between a pFET bottom source/drain (S/D) region and a pFET top S/D region; a pFET gate upon around the pFET channel fin, the pFET gate comprising a first pFET gate portion directly connected to a first side of the pFET channel fin and a second pFET gate portion directly connected to a second side of the pFET channel fin, the first pFET gate portion comprising a first pFET gate sidewall and a second pFET gate sidewall, and the second pFET gate portion comprising a third pFET gate sidewall; a pFET top metallization upon the pFET top S/D region; a pFET contact metallization connected to the pFET bottom S/D region; and a pFET vertical liner directly connected the third pFET gate sidewall and directly connected to a sidewall of the pFET contact metallization;
a nFET comprising: a nFET channel fin between a nFET bottom S/D region and a nFET top S/D region; a nFET gate around the nFET channel fin, the nFET gate comprising a first nFET gate portion directly connected to a first side of the nFET channel fin and a second nFET gate portion directly connected to a second side of the nFET channel fin, the first nFET gate portion comprising a first nFET gate sidewall and a second nFET gate sidewall, and the second nFET gate portion comprising a third nFET gate sidewall; a nFET top metallization upon the nFET top S/D region; a nFET contact metallization connected to the nFET bottom S/D region; and a nFET vertical liner directly connected a first sidewall of the nFET gate and directly connected to a sidewall of the nFET contact metallization;
a shared contact metallization connected to the first sidewall of the pFET gate and connected to the first sidewall of the nFET gate;
a shared vertical liner in direct contact with at least the second sidewall of the pFET gate, in direct contact with the shared contact metallization, and in direct contact with at least the second sidewall of the nFET gate; and
a shared top spacer around the pFET channel around the nFET channel and in direct contact with the shared vertical liner.

9. The semiconductor device of claim 8, further comprising:
a pFET inner spacer below the pFET vertical liner and that is directly connected to the third sidewall of the pFET gate and that is directly connected to the sidewall of the pFET contact metallization; and
a nFET inner spacer below the nFET vertical liner and that is directly connected to the third sidewall of the nFET gate and that is directly connected to the sidewall of the nFET contact metallization.

10. The semiconductor device of claim 9, further comprising:
a pFET bottom spacer below the pFET inner spacer and between the pFET contact metallization and the pFET channel fin; and
a nFET bottom spacer below the nFET inner spacer and between the nFET contact metallization and the nFET channel fin.

11. The semiconductor device of claim 8, wherein a top surface of pFET top metallization is below a top surface of the pFET contact metallization and is below a top surface of the shared contact metallization, wherein a top surface of nFET top metallization is below a top surface of the nFET contact metallization and is below the top surface of the shared contact metallization.

12. The semiconductor device of claim 8, wherein respective sidewalls of the pFET top S/D region physically contact the pFET vertical liner and the shared vertical liner and wherein respective sidewalls of the nFET top S/D region physically contact the nFET vertical liner and the shared vertical liner.

13. The semiconductor device of claim 8, wherein respective sidewalls of the pFET top metallization physically contact the pFET vertical liner and the shared vertical liner, and wherein respective sidewalls of the nFET top metallization physically contact the nFET vertical liner and the shared vertical liner.

14. The semiconductor device of claim 8, wherein a top surface of the shared vertical liner is coplanar with a top surface of the shared contact metallization, wherein a top surface of the pFET vertical liner is coplanar with a top surface of the pFET top metallization, and wherein a top surface of the nFET vertical liner is coplanar with a top surface of the nFET top metallization.

* * * * *